United States Patent
Zhou et al.

(10) Patent No.: US 12,125,711 B2
(45) Date of Patent: Oct. 22, 2024

(54) REDUCING ROUGHNESS OF EXTREME ULTRAVIOLET LITHOGRAPHY RESISTS

(71) Applicant: Lam Research Corporation, Fremont, CA (US)

(72) Inventors: Xiang Zhou, Mountain View, CA (US); Teng Hooi Goh, Fremont, CA (US); Yoshie Kimura, Castro Valley, CA (US)

(73) Assignee: Lam Research Corporation, Fremont, CA (US)

( * ) Notice: Subject to any disclaimer, the term of this patent is extended or adjusted under 35 U.S.C. 154(b) by 206 days.

(21) Appl. No.: 17/593,371

(22) PCT Filed: Mar. 17, 2020

(86) PCT No.: PCT/US2020/023146
§ 371 (c)(1),
(2) Date: Sep. 16, 2021

(87) PCT Pub. No.: WO2020/190941
PCT Pub. Date: Sep. 24, 2020

(65) Prior Publication Data
US 2022/0157617 A1    May 19, 2022

Related U.S. Application Data

(60) Provisional application No. 62/820,184, filed on Mar. 18, 2019.

(51) Int. Cl.
*H01L 21/311* (2006.01)
*H01L 21/02* (2006.01)

(52) U.S. Cl.
CPC ............ *H01L 21/31144* (2013.01); *H01L 21/02164* (2013.01); *H01L 21/0228* (2013.01)

(58) Field of Classification Search
CPC ......... H01L 21/31144; H01L 21/02164; H01L 21/0228; H01L 21/0273; H01L 21/0332;
(Continued)

(56) References Cited

U.S. PATENT DOCUMENTS 3,442,648 A   5/1969  Smith et al.
3,513,010 A   5/1970  Notley et al.
(Continued)

FOREIGN PATENT DOCUMENTS

CN    1904727 A    1/2007
CN    102610516 A  7/2012
(Continued)

OTHER PUBLICATIONS

Shestaeva et al. ("Mechanical, structural, and optical properties of PEALD metallic oxides for optical applications", Applied Optics, vol. 56, No. 4, Feb. 1, 2017). (Year: 2017).*
(Continued)

*Primary Examiner* — Duy Vu N Deo
*Assistant Examiner* — Christopher Remavege
(74) *Attorney, Agent, or Firm* — Weaver Austin Villeneuve & Sampson LLP

(57) ABSTRACT

Provided herein are methods and systems for reducing roughness of EUV resists and improving etched features. The methods may involve depositing a thin film on a patterned EUV resist having a stress level that is less compressive than a stress level of the patterned EUV resist. The resulting composite stress may reduce buckling and/or bulging of the patterned EUV resist.

20 Claims, 9 Drawing Sheets

(58) Field of Classification Search
CPC ......... H01L 21/02219; H01L 21/02274; H01L 21/3086; H01L 21/3081; C23C 16/045; C23C 16/40; C23C 16/45525; C23C 16/402; C23C 16/45527; G03F 7/40; G03F 7/0042

See application file for complete search history.

(56) References Cited

U.S. PATENT DOCUMENTS

| | | | |
|---|---|---|---|
| 3,529,963 A | 9/1970 | Marchese et al. |
| 3,576,755 A | 4/1971 | Patella et al. |
| 3,720,515 A | 3/1973 | Stanley |
| 4,241,165 A | 12/1980 | Hughes et al. |
| 4,328,298 A | 5/1982 | Nester |
| 4,341,592 A | 7/1982 | Shortes et al. |
| 4,590,149 A | 5/1986 | Nakane et al. |
| 4,738,748 A | 4/1988 | Kisa |
| 4,806,456 A | 2/1989 | Katoh |
| 4,834,834 A | 5/1989 | Ehrlich et al. |
| 4,842,989 A | 6/1989 | Taniguchi et al. |
| 4,845,053 A | 7/1989 | Zajac |
| 4,940,854 A | 7/1990 | Debe |
| 5,077,085 A | 12/1991 | Schnur et al. |
| 5,322,765 A | 6/1994 | Clecak et al. |
| 5,445,988 A | 8/1995 | Schwalke |
| 5,534,312 A | 7/1996 | Hill et al. |
| 5,914,278 A | 6/1999 | Boitnott et al. |
| 5,925,494 A | 7/1999 | Horn |
| 5,976,993 A | 11/1999 | Ravi et al. |
| 6,017,553 A | 1/2000 | Burrell et al. |
| 6,045,877 A | 4/2000 | Gleason et al. |
| 6,162,577 A | 12/2000 | Felter et al. |
| 6,179,922 B1 | 1/2001 | Ishikawa et al. |
| 6,261,938 B1 | 7/2001 | Beauvais et al. |
| 6,290,779 B1 | 9/2001 | Saleh et al. |
| 6,348,239 B1 | 2/2002 | Hill et al. |
| 6,444,277 B1 | 9/2002 | Law et al. |
| 6,448,097 B1 | 9/2002 | Singh et al. |
| 6,573,030 B1 | 6/2003 | Fairbairn et al. |
| 6,607,867 B1 | 8/2003 | Kim et al. |
| 6,797,439 B1 | 9/2004 | Alpay |
| 6,841,341 B2 | 1/2005 | Fairbairn et al. |
| 6,841,943 B2 | 1/2005 | Vahedi et al. |
| 7,169,440 B2 | 1/2007 | Balasubramaniam et al. |
| 7,223,526 B2 | 5/2007 | Fairbairn et al. |
| 7,307,695 B2 | 12/2007 | Hazenberg et al. |
| 7,335,462 B2 | 2/2008 | Fairbairn et al. |
| 7,608,367 B1 | 10/2009 | Aigeldinger et al. |
| 8,318,575 B2 | 11/2012 | Lehnert et al. |
| 8,465,903 B2 | 6/2013 | Weidman et al. |
| 8,536,068 B2 | 9/2013 | Weidman et al. |
| 8,552,334 B2 | 10/2013 | Tappan et al. |
| 8,664,124 B2 | 3/2014 | Graff |
| 8,664,513 B2 | 3/2014 | Pfenninger et al. |
| 8,703,386 B2 | 4/2014 | Bass et al. |
| 8,709,551 B2 | 4/2014 | Fox et al. |
| 8,741,394 B2 | 6/2014 | Haverkamp et al. |
| 8,808,561 B2 | 8/2014 | Kanarik |
| 8,883,028 B2 | 11/2014 | Kanarik |
| 8,883,405 B2 | 11/2014 | Shiobara |
| 8,895,415 B1 | 11/2014 | Fox et al. |
| 9,023,731 B2 | 5/2015 | Ji et al. |
| 9,261,784 B2 | 2/2016 | Wuister et al. |
| 9,310,684 B2 | 4/2016 | Meyers et al. |
| 9,551,924 B2 | 1/2017 | Burkhardt et al. |
| 9,576,811 B2 | 2/2017 | Kanarik et al. |
| 9,632,411 B2 | 4/2017 | Michaelson et al. |
| 9,778,561 B2 | 10/2017 | Marks et al. |
| 9,823,564 B2 | 11/2017 | Stowers et al. |
| 9,996,004 B2 | 6/2018 | Smith et al. |
| 10,025,179 B2 | 7/2018 | Meyers et al. |
| 10,228,618 B2 | 3/2019 | Meyers et al. |
| 10,297,440 B2* | 5/2019 | Yamazaki ............ H01L 21/0228 |
| 10,416,554 B2 | 9/2019 | Meyers et al. |
| 10,514,598 B2 | 12/2019 | Marks et al. |
| 10,580,585 B2 | 3/2020 | Snaith et al. |
| 10,627,719 B2 | 4/2020 | Waller et al. |
| 10,642,153 B2 | 5/2020 | Meyers et al. |
| 10,649,328 B2 | 5/2020 | Stowers et al. |
| 10,732,505 B1 | 8/2020 | Meyers et al. |
| 10,775,696 B2 | 9/2020 | Meyers et al. |
| 10,782,610 B2 | 9/2020 | Stowers et al. |
| 10,787,466 B2 | 9/2020 | Edson et al. |
| 10,796,912 B2 | 10/2020 | Shamma et al. |
| 10,831,096 B2 | 11/2020 | Marks et al. |
| 11,209,729 B2 | 12/2021 | Marks et al. |
| 11,257,674 B2 | 2/2022 | Shamma et al. |
| 11,314,168 B2 | 4/2022 | Tan et al. |
| 11,705,332 B2* | 7/2023 | Kuo ................ H01L 21/0275 438/680 |
| 2001/0024769 A1 | 9/2001 | Donoghue et al. |
| 2002/0017243 A1 | 2/2002 | Pyo |
| 2002/0180372 A1 | 12/2002 | Yamazaki |
| 2003/0008246 A1 | 1/2003 | Cheng et al. |
| 2003/0183244 A1 | 10/2003 | Rossman |
| 2004/0113087 A1 | 6/2004 | Ikeda et al. |
| 2004/0175631 A1 | 9/2004 | Crocker et al. |
| 2004/0191423 A1 | 9/2004 | Ruan et al. |
| 2004/0213563 A1 | 10/2004 | Irie |
| 2005/0167617 A1 | 8/2005 | Derra et al. |
| 2005/0208389 A1 | 9/2005 | Ishibashi et al. |
| 2005/0253077 A1 | 11/2005 | Ikeda et al. |
| 2006/0001064 A1 | 1/2006 | Hill et al. |
| 2006/0068173 A1 | 3/2006 | Kajiyama et al. |
| 2006/0147818 A1 | 7/2006 | Lee |
| 2006/0151462 A1 | 7/2006 | Lee et al. |
| 2006/0166537 A1 | 7/2006 | Thompson et al. |
| 2006/0172530 A1 | 8/2006 | Cheng et al. |
| 2006/0175558 A1 | 8/2006 | Bakker et al. |
| 2006/0287207 A1 | 12/2006 | Park et al. |
| 2007/0017386 A1 | 1/2007 | Kamei |
| 2007/0037410 A1 | 2/2007 | Chang et al. |
| 2007/0074541 A1 | 4/2007 | Badding et al. |
| 2007/0117040 A1 | 5/2007 | Brock et al. |
| 2007/0181816 A1 | 8/2007 | Ikeda et al. |
| 2007/0212889 A1 | 9/2007 | Abatchev et al. |
| 2007/0287073 A1 | 12/2007 | Goodwin |
| 2008/0070128 A1 | 3/2008 | Wu et al. |
| 2008/0157011 A1 | 7/2008 | Nagai et al. |
| 2009/0153826 A1 | 6/2009 | Sewell et al. |
| 2009/0197086 A1 | 8/2009 | Rathi et al. |
| 2009/0208880 A1 | 8/2009 | Nemani et al. |
| 2009/0239155 A1 | 9/2009 | Levinson et al. |
| 2009/0286402 A1* | 11/2009 | Xia ................ H01L 21/0338 257/E21.249 |
| 2009/0305174 A1 | 12/2009 | Shiobara et al. |
| 2009/0317742 A1 | 12/2009 | Toriumi et al. |
| 2009/0321707 A1 | 12/2009 | Metz et al. |
| 2009/0325387 A1 | 12/2009 | Chen et al. |
| 2010/0022078 A1 | 1/2010 | Rockenberger et al. |
| 2010/0131093 A1 | 5/2010 | Yokoyama et al. |
| 2010/0197135 A1 | 8/2010 | Ishizaka |
| 2010/0266969 A1 | 10/2010 | Shiraishi et al. |
| 2010/0297847 A1 | 11/2010 | Cheng et al. |
| 2010/0304027 A1 | 12/2010 | Lee et al. |
| 2010/0310790 A1 | 12/2010 | Chang et al. |
| 2011/0059617 A1 | 3/2011 | Mitchell et al. |
| 2011/0104595 A1 | 5/2011 | Hayashi et al. |
| 2011/0117702 A1 | 5/2011 | Rietzler et al. |
| 2011/0198756 A1 | 8/2011 | Thenappan et al. |
| 2011/0201210 A1 | 8/2011 | Sato et al. |
| 2011/0209725 A1 | 9/2011 | Kim et al. |
| 2012/0068347 A1 | 3/2012 | Isobayashi et al. |
| 2012/0088193 A1 | 4/2012 | Weidman et al. |
| 2012/0088369 A1 | 4/2012 | Weidman et al. |
| 2012/0090547 A1 | 4/2012 | Wang et al. |
| 2012/0126358 A1 | 5/2012 | Arnold et al. |
| 2012/0142172 A1 | 6/2012 | Fox et al. |
| 2012/0193762 A1 | 8/2012 | Lin et al. |
| 2012/0202357 A1 | 8/2012 | Sato et al. |
| 2012/0208125 A1 | 8/2012 | Hatakeyama |
| 2012/0223418 A1 | 9/2012 | Stowers et al. |
| 2012/0322011 A1 | 12/2012 | Wu et al. |
| 2013/0023124 A1 | 1/2013 | Nemani et al. |

(56) References Cited

U.S. PATENT DOCUMENTS

| | | | |
|---|---|---|---|
| 2013/0109186 A1* | 5/2013 | Zhang | H01L 29/7843 257/E21.214 |
| 2013/0129995 A1 | 5/2013 | Ouattara et al. | |
| 2013/0157177 A1 | 6/2013 | Yu et al. | |
| 2013/0177847 A1 | 7/2013 | Chatterjee et al. | |
| 2013/0224652 A1 | 8/2013 | Bass et al. | |
| 2013/0316518 A1 | 11/2013 | Hollister et al. | |
| 2013/0330928 A1 | 12/2013 | Ishikawa et al. | |
| 2013/0330932 A1 | 12/2013 | Rangarajan et al. | |
| 2014/0014745 A1 | 1/2014 | Burrows et al. | |
| 2014/0120688 A1 | 5/2014 | Booth, Jr. et al. | |
| 2014/0134827 A1 | 5/2014 | Swaminathan et al. | |
| 2014/0170563 A1 | 6/2014 | Hatakeyama | |
| 2014/0170853 A1 | 6/2014 | Shamma et al. | |
| 2014/0175617 A1 | 6/2014 | Antonelli et al. | |
| 2014/0193580 A1 | 7/2014 | Tiron et al. | |
| 2014/0209015 A1 | 7/2014 | Yamada et al. | |
| 2014/0220489 A1 | 8/2014 | Kozuma et al. | |
| 2014/0239462 A1 | 8/2014 | Shamma et al. | |
| 2014/0268082 A1 | 9/2014 | Michaelson et al. | |
| 2014/0272726 A1 | 9/2014 | Chang | |
| 2014/0357064 A1 | 12/2014 | Fox et al. | |
| 2015/0041809 A1 | 2/2015 | Arnold et al. | |
| 2015/0056542 A1 | 2/2015 | Meyers et al. | |
| 2015/0077733 A1 | 3/2015 | Huang et al. | |
| 2015/0079393 A1 | 3/2015 | Freedman et al. | |
| 2015/0125679 A1 | 5/2015 | Ishikawa | |
| 2015/0132965 A1 | 5/2015 | Devilliers et al. | |
| 2015/0152551 A1 | 6/2015 | Yamaguchi et al. | |
| 2015/0170957 A1 | 6/2015 | Tsao | |
| 2015/0194343 A1 | 7/2015 | Chi et al. | |
| 2015/0217330 A1 | 8/2015 | Haukka et al. | |
| 2015/0221519 A1 | 8/2015 | Marks et al. | |
| 2015/0243520 A1* | 8/2015 | Park | G03F 7/26 438/703 |
| 2015/0303064 A1 | 10/2015 | Singer et al. | |
| 2015/0332922 A1 | 11/2015 | Chien et al. | |
| 2016/0011505 A1 | 1/2016 | Stowers et al. | |
| 2016/0011516 A1 | 1/2016 | Devilliers | |
| 2016/0035631 A1 | 2/2016 | Lee et al. | |
| 2016/0086864 A1 | 3/2016 | Fischer et al. | |
| 2016/0116839 A1 | 4/2016 | Meyers et al. | |
| 2016/0118246 A1 | 4/2016 | Kang et al. | |
| 2016/0135274 A1 | 5/2016 | Fischer et al. | |
| 2016/0179005 A1 | 6/2016 | Shamma et al. | |
| 2016/0216606 A1 | 7/2016 | Meyers et al. | |
| 2016/0284559 A1 | 9/2016 | Kikuchi et al. | |
| 2016/0293405 A1 | 10/2016 | Matsumoto et al. | |
| 2016/0314964 A1 | 10/2016 | Tang et al. | |
| 2016/0329206 A1 | 11/2016 | Kumar et al. | |
| 2016/0357107 A1 | 12/2016 | Buchberger, Jr. et al. | |
| 2016/0365248 A1 | 12/2016 | Mebarki et al. | |
| 2016/0379824 A1 | 12/2016 | Wise et al. | |
| 2017/0010535 A1 | 1/2017 | Fujitani et al. | |
| 2017/0069462 A1 | 3/2017 | Kanarik et al. | |
| 2017/0102612 A1 | 4/2017 | Meyers et al. | |
| 2017/0146909 A1 | 5/2017 | Smith et al. | |
| 2017/0154766 A1 | 6/2017 | Ogihara et al. | |
| 2017/0162522 A1 | 6/2017 | Chang et al. | |
| 2017/0168398 A1 | 6/2017 | Zi et al. | |
| 2017/0176858 A1 | 6/2017 | Hirano | |
| 2017/0184961 A1 | 6/2017 | Nakagawa et al. | |
| 2017/0192357 A1 | 7/2017 | Carcasi et al. | |
| 2017/0261850 A1 | 9/2017 | Stowers et al. | |
| 2018/0004083 A1 | 1/2018 | Marks et al. | |
| 2018/0012759 A1 | 1/2018 | Smith et al. | |
| 2018/0039172 A1 | 2/2018 | Stowers et al. | |
| 2018/0039182 A1 | 2/2018 | Zi et al. | |
| 2018/0046086 A1 | 2/2018 | Waller et al. | |
| 2018/0061663 A1 | 3/2018 | Chandrashekar et al. | |
| 2018/0082960 A1 | 3/2018 | Bellotti et al. | |
| 2018/0122648 A1 | 5/2018 | Kim et al. | |
| 2018/0151350 A1* | 5/2018 | Li | C23C 16/483 |
| 2018/0166278 A1 | 6/2018 | Belyansky et al. | |
| 2018/0224744 A1 | 8/2018 | Bae et al. | |
| 2018/0233362 A1 | 8/2018 | Glodde et al. | |
| 2018/0307137 A1 | 10/2018 | Meyers et al. | |
| 2018/0308687 A1 | 10/2018 | Smith et al. | |
| 2018/0314167 A1 | 11/2018 | Chang et al. | |
| 2018/0337046 A1 | 11/2018 | Shamma et al. | |
| 2018/0350879 A1 | 12/2018 | Sel et al. | |
| 2018/0354804 A1 | 12/2018 | Venkatasubramanian et al. | |
| 2019/0027357 A1 | 1/2019 | Girard et al. | |
| 2019/0043731 A1 | 2/2019 | Bristol et al. | |
| 2019/0094175 A1 | 3/2019 | Merriman et al. | |
| 2019/0094685 A1 | 3/2019 | Marks et al. | |
| 2019/0115206 A1* | 4/2019 | Kim | C23C 16/45525 |
| 2019/0129307 A1 | 5/2019 | Kwon et al. | |
| 2019/0137870 A1 | 5/2019 | Meyers et al. | |
| 2019/0153001 A1 | 5/2019 | Cardineau et al. | |
| 2019/0157066 A1* | 5/2019 | Zhou | H01L 21/823431 |
| 2019/0163056 A1 | 5/2019 | Maes et al. | |
| 2019/0172714 A1 | 6/2019 | Bobek et al. | |
| 2019/0187556 A1 | 6/2019 | Park et al. | |
| 2019/0198338 A1 | 6/2019 | Kim et al. | |
| 2019/0244809 A1 | 8/2019 | Ono | |
| 2019/0259601 A1* | 8/2019 | De Silva | H01L 21/32139 |
| 2019/0308998 A1 | 10/2019 | Cardineau et al. | |
| 2019/0315781 A1 | 10/2019 | Edson et al. | |
| 2019/0315782 A1 | 10/2019 | Edson et al. | |
| 2019/0332014 A1 | 10/2019 | Ookubo et al. | |
| 2019/0333777 A1 | 10/2019 | Hsieh et al. | |
| 2019/0341256 A1* | 11/2019 | Shankar | H01L 21/0273 |
| 2019/0348292 A1 | 11/2019 | Dutta et al. | |
| 2019/0352776 A1 | 11/2019 | Parikh | |
| 2019/0369489 A1 | 12/2019 | Meyers et al. | |
| 2019/0391486 A1 | 12/2019 | Jiang et al. | |
| 2019/0393035 A1* | 12/2019 | O'Meara | H01L 21/02186 |
| 2020/0051781 A1 | 2/2020 | Fujimura et al. | |
| 2020/0064733 A1 | 2/2020 | Meyers et al. | |
| 2020/0066536 A1 | 2/2020 | Yaegashi | |
| 2020/0089104 A1 | 3/2020 | Marks et al. | |
| 2020/0124970 A1 | 4/2020 | Kocsis et al. | |
| 2020/0174374 A1 | 6/2020 | Liao et al. | |
| 2020/0176246 A1 | 6/2020 | Huotari et al. | |
| 2020/0209756 A1 | 7/2020 | Waller et al. | |
| 2020/0239498 A1 | 7/2020 | Clark et al. | |
| 2020/0241413 A1 | 7/2020 | Clark et al. | |
| 2020/0257196 A1 | 8/2020 | Meyers et al. | |
| 2020/0292937 A1 | 9/2020 | Stowers et al. | |
| 2020/0393765 A1 | 12/2020 | Sakanishi | |
| 2021/0013034 A1 | 1/2021 | Wu et al. | |
| 2021/0366792 A1 | 11/2021 | Fulford et al. | |
| 2021/0397085 A1 | 12/2021 | Weidman et al. | |
| 2022/0013399 A1 | 1/2022 | Rondon et al. | |
| 2022/0020584 A1 | 1/2022 | Volosskiy et al. | |
| 2022/0035247 A1 | 2/2022 | Tan et al. | |
| 2022/0043334 A1 | 2/2022 | Tan et al. | |
| 2022/0075260 A1 | 3/2022 | Marks et al. | |
| 2022/0122846 A1 | 4/2022 | Shamma et al. | |
| 2022/0216050 A1 | 7/2022 | Yu et al. | |
| 2022/0244645 A1 | 8/2022 | Tan et al. | |
| 2022/0299877 A1 | 9/2022 | Weidman et al. | |
| 2022/0308454 A1 | 9/2022 | Weidman et al. | |
| 2022/0308462 A1 | 9/2022 | Berney et al. | |
| 2022/0342301 A1 | 10/2022 | Weidman et al. | |
| 2022/0344136 A1 | 10/2022 | Peter et al. | |
| 2022/0365434 A1 | 11/2022 | Nardi et al. | |
| 2023/0031955 A1 | 2/2023 | Yu et al. | |
| 2023/0045336 A1 | 2/2023 | Yu et al. | |
| 2023/0107357 A1 | 4/2023 | Dictus et al. | |
| 2023/0185196 A1 | 6/2023 | Weidman et al. | |
| 2023/0259025 A1 | 8/2023 | Hansen et al. | |
| 2023/0266662 A1 | 8/2023 | Marks et al. | |
| 2023/0266664 A1 | 8/2023 | Hansen et al. | |
| 2023/0266670 A1 | 8/2023 | Hansen et al. | |
| 2023/0273516 A1 | 8/2023 | Marks et al. | |
| 2023/0288798 A1 | 9/2023 | Hansen et al. | |

(56) References Cited

U.S. PATENT DOCUMENTS

| | | | |
|---|---|---|---|
| 2023/0314946 | A1 | 10/2023 | Hansen et al. |
| 2023/0343593 | A1 | 10/2023 | Nagabhirava et al. |

FOREIGN PATENT DOCUMENTS

| | | | |
|---|---|---|---|
| CN | 103119695 A | 5/2013 | |
| CN | 103243310 A | 8/2013 | |
| CN | 105579906 A | 5/2016 | |
| CN | 106876251 A | 6/2017 | |
| CN | 107611012 A | 1/2018 | |
| CN | 108351586 A | 7/2018 | |
| CN | 108351594 A | 7/2018 | |
| CN | 108388079 A | 8/2018 | |
| CN | 109521657 A | 3/2019 | |
| CN | 109976097 A | 7/2019 | |
| CN | 111258190 A | 6/2020 | |
| EP | 1123423 B1 | 8/2007 | |
| EP | 2256789 A1 | 12/2010 | |
| EP | 2608247 A1 | 6/2013 | |
| EP | 3230294 A1 | 10/2017 | |
| EP | 3258317 A1 | 12/2017 | |
| JP | H07106224 A | 4/1995 | |
| JP | H08339950 A | 12/1996 | |
| JP | H10209133 A | 8/1998 | |
| JP | 2003213001 A | 7/2003 | |
| JP | 2003532303 A | 10/2003 | |
| JP | 2004006798 A | 1/2004 | |
| JP | 2005504146 A | 2/2005 | |
| JP | 2006253282 A | 9/2006 | |
| JP | 2009192350 A | 8/2009 | |
| JP | 2010016083 A | 1/2010 | |
| JP | 2010016314 A | 1/2010 | |
| JP | 2010531931 A | 9/2010 | |
| JP | 2010239087 A | 10/2010 | |
| JP | 2011520242 A | 7/2011 | |
| JP | 2011529126 A | 12/2011 | |
| JP | 2012142481 A | 7/2012 | |
| JP | 2012173315 A | 9/2012 | |
| JP | 2012185485 A | 9/2012 | |
| JP | 5055743 B2 | 10/2012 | |
| JP | 2013096011 A | 5/2013 | |
| JP | 2013517600 A | 5/2013 | |
| JP | 2013526061 A | 6/2013 | |
| JP | 2013145874 A | 7/2013 | |
| JP | 5544914 B2 | 7/2014 | |
| JP | 2014521111 A | 8/2014 | |
| JP | 5705103 B2 | 4/2015 | |
| JP | 2015201622 A | 11/2015 | |
| JP | 2016131238 A | 7/2016 | |
| JP | 2016208027 A | 12/2016 | |
| JP | 2017045869 A | 3/2017 | |
| JP | 2017108053 A | 6/2017 | |
| JP | 2018518688 A | 7/2018 | |
| JP | 2019500490 A | 1/2019 | |
| JP | 2019506730 A | 3/2019 | |
| JP | 2019053305 A | 4/2019 | |
| JP | 2019135755 A | 8/2019 | |
| JP | 2019192814 A | 10/2019 | |
| KR | 960000375 B1 | 1/1996 | |
| KR | 100841495 B1 | 6/2008 | |
| KR | 20090042059 A | 4/2009 | |
| KR | 20130093038 A | 8/2013 | |
| KR | 20140106442 A | 9/2014 | |
| KR | 20170066225 A | 6/2017 | |
| KR | 20180054917 A | 5/2018 | |
| KR | 20190085654 A | 7/2019 | |
| TW | 201224190 A | 6/2012 | |
| TW | I365354 B | 6/2012 | |
| TW | 201241555 A | 10/2012 | |
| TW | I494689 B | 8/2015 | |
| TW | 201729006 A | 8/2017 | |
| TW | 201734025 A | 10/2017 | |
| TW | 201907445 A | 2/2019 | |
| WO | WO-03029015 A2 | 4/2003 | |
| WO | WO-2004095551 A1 | 11/2004 | |
| WO | WO-2007123539 A1 | 11/2007 | |
| WO | WO-2011081151 A1 | 7/2011 | |
| WO | WO-2011087984 A2 | 7/2011 | |
| WO | WO-2011137059 A2 | 11/2011 | |
| WO | WO-2012048094 A3 | 7/2012 | |
| WO | WO-2013007442 A1 | 1/2013 | |
| WO | WO-2014152023 A1 | 9/2014 | |
| WO | WO-2016065120 A1 | 4/2016 | |
| WO | WO-2016144960 A1 | 9/2016 | |
| WO | WO-2017066319 A2 | 4/2017 | |
| WO | WO-2017109040 A1 | 6/2017 | |
| WO | WO-2017198418 A1 | 11/2017 | |
| WO | WO-2018004551 A1 | 1/2018 | |
| WO | WO-2018061670 A1 | 4/2018 | |
| WO | WO-2019163455 A1 | 8/2019 | |
| WO | WO-2019217749 A1 | 11/2019 | |
| WO | WO-2019222320 A1 | 11/2019 | |
| WO | WO-2019230462 A1 | 12/2019 | |
| WO | WO-2019241402 A1 | 12/2019 | |
| WO | WO-2020030855 A2 | 2/2020 | |
| WO | WO-2020102085 A1 | 5/2020 | |
| WO | WO-2020132281 A1 | 6/2020 | |
| WO | WO-2020223011 A1 | 11/2020 | |
| WO | WO-2020263750 A1 | 12/2020 | |
| WO | WO-2020264557 A1 | 12/2020 | |
| WO | WO-2021067632 A2 | 4/2021 | |
| WO | WO-2021072042 A1 | 4/2021 | |

OTHER PUBLICATIONS

Chinese First Office Action dated Jun. 26, 2018 issued in Application No. CN 201610300671.9.

Chinese First Office Action dated May 24, 2017 issued in Application No. CN 201510053668.7.

Chinese Second Office Action dated Feb. 28, 2018 issued in Application No. CN 201510053668.7.

Coons et al., (2010) "Comparison of EUV spectral and ion emission features from laser-produced Sn and Li plasmas," Extreme Ultraviolet (EUV) Lithography, Proc. Of SPIE, 7636:763636-1 to 763636-7.

Fan, Y. et al., (2016) "Benchmarking Study of EUV Resists for NXE:3300B," Proc. of SPIE, 9776:97760W-1 to 97760W-11 [Downloaded From http://proceedings.spiedigitallibrary.org/ on Mar. 30, 2017].

FUJIFILM Corp., (Presentation) "Negative tone development process for double patterning," 5th International Symposium on Immersion Lithography, Sep. 2008, Presentation Slides No. p. 1-p. 27.

FUJIFILM Corp., (Safety Data Sheet) Name of Substance: n-Butyl acetate; Trade Name of Substance: FN-DP001 Ultra Pure Developer, Revision Date: Nov. 25, 2013, MSDS file: 16328_GB_EN_V2.0, pp. 1-9.

Gangnaik, A.S. et al., (Jan. 12, 2017) "New Generation Electron Beam Resists: A Review," Chem. Mater., 29:1898-1917.

Gerritsen et al., (Apr. 1, 1986) "Laser-generated plasma as soft x-ray source," J. Appl. Phys., 59(7):2337-2344.

International Preliminary Report on Patentability dated Nov. 28, 2019 issued in Application No. PCT/US2018/032783.

International Preliminary Report on Patentability dated Nov. 7, 2019 issued in Application No. PCT/US2018/028192.

International Preliminary Report on Patentability dated Sep. 30, 2021 issued in Application No. PCT/US2020/023146.

International Search Report and Written Opinion dated Aug. 8, 2018 issued in Application No. PCT/US2018/028192.

International Search Report and Written Opinion dated Jul. 17, 2020 issued in Application No. PCT/US2020/023146.

International Search Report and Written Opinion dated Oct. 16, 2018 issued in Application No. PCT/US2018/032783.

Japanese Decision to Grant dated Feb. 12, 2019 issued in Application No. JP 2015-016254.

Japanese Decision to Grant dated May 3, 2021 issued in Application No. JP 2016-220096.

Japanese First Office Action dated Oct. 30, 2018 issued in Application No. JP 2015-016254.

(56) References Cited

OTHER PUBLICATIONS

Japanese First Office Action dated Sep. 15, 2020 issued in Application No. JP 2016- 220096.
Korean Decision for Grant dated Sep. 2, 2021 issued in Application No. KR 10-2015-0015184.
Korean First Office Action dated Dec. 22, 2020 issued in Application No. KR 10-2015-0015184.
Korean Second Office Action dated Jul. 27, 2021 issued in Application No. KR 10-2015-0015184.
McGinniss, Vincent D., (1978) "Light Sources," Edited by: Pappas, S. Peter, UV Curing: Science and Technology; technology marketing corporation, 642 Westover Rd., Stamford, CT, USA; pp. 96-129.
Rothschild, et al., "Liquid immersion lithography: Why, how, and when?" Journal Vacuum Science Technology, Nov./Dec. 2004, pp. 2877-2881.
Santillan et al., "In Situ analysis of negative-tone resist pattern formation using organic-solvent-based developer process," Applied Physics Express, vol. 7 (2014), pp. 016501-1-016501-4. [retrieved Sep. 20, 2017] URL: http:dx.doi.org/10.7567/APEX.7.016501.
Spitzer et al., (Mar. 1, 1986) "Conversion efficiencies from laser-produced plasmas in the extreme ultraviolet regime," J. Appl. Phys., 79(5):2251-2258.
Stowers et al.; "Directly patterned inorganic hard mask for EUV lithography"; proceedings of the SPIE 7969; Extreme Ultraviolet (EUV) Lithography 11, 796915-1-11 (Apr. 7, 2011), event: SPI E Advanced Lithography, 2011, San Jose California.
Stulen, et al., "Extreme Ultraviolet Lithography" IEEE Journal of Quantum Electronics, vol. 35, No. 5, May 1999, pp. 694-699.
Taiwanese First Office Action dated Aug. 10, 2020 issued in Application No. TW 105137362.
Taiwanese First Office Action dated May 31, 2018 issued in Application No. TW 104103153.
Taiwanese Second Office Action dated Nov. 18, 2020 issued in Application No. TW 105137362.
TW First Office Action dated Oct. 6, 2021, in application No. TW20180116415 with English translation.
US Final Office Action, dated Feb. 5, 2019 issued in U.S. Appl. No. 15/495,701.
US Final Office Action, dated May 11, 2017, issued in U.S. Appl. No. 14/610,038.
US Final Office Action, dated Sep. 10, 2018, issued in U.S. Appl. No. 15/691,659.
US Notice of Allowance, dated Apr. 25, 2018 issued in U.S. Appl. No. 14/948,109.
US Notice of Allowance, dated Aug. 22, 2017, issued in U.S. Appl. No. 14/610,038.
US Notice of Allowance, dated Jul. 28, 2020, issued in U.S. Appl. No. 16/206,959.
US Notice of Allowance, dated Jun. 10, 2020 issued in U.S. Appl. No. 15/979,340.
US Notice of Allowance dated Jun. 23, 2014 issued in U.S. Appl. No. 13/907,742.
US Notice of Allowance dated Oct. 16, 2014 issued in U.S. Appl. No. 13/907,742.
US Notice of Allowance dated Sep. 15, 2021 issued in U.S. Appl. No. 16/691,508.
US Notice of Allowance, dated Sep. 19, 2019, issued in U.S. Appl. No. 15/691,659.
US Notice of Allowance, dated Sep. 30, 2021 issued in U.S. Appl. No. 17/008,095.
US Notice of Allowance dated Sep. 9, 2021 issued in U.S. Appl. No. 16/691,508.
US Office Action, dated Apr. 9, 2019, issued in U.S. Appl. No. 15/691,659.
US Office Action, dated Aug. 9, 2018, issued in U.S. Appl. No. 15/495,701.
US Office Action, dated Jan. 23, 2017, issued in U.S. Appl. No. 14/610,038.
US Office Action, dated Mar. 18, 2021 issued in U.S. Appl. No. 17/008,095.
US Office Action, dated Mar. 5, 2020, issued in U.S. Appl. No. 16/206,959.
US Office Action dated May 14, 2021, issued in U.S. Appl. No. 16/691,508.
US Office Action, dated May 21, 2018, issued in U.S. Appl. No. 15/691,659.
US Office Action, dated Nov. 2, 2017, issued in U.S. Appl. No. 14/948,109.
US Office Action dated Nov. 3, 2016 issued in U.S. Appl. No. 14/708,050.
US Office Action, dated Nov. 6, 2019 issued in U.S. Appl. No. 15/979,340.
U.S. Appl. No. 17/593,371, inventors Zhou et al., filed Sep. 16, 2021.
U.S. Appl. No. 14/708,050, filed May 8, 2015, entitled "Methods of Modulating Residual Stress in Thin Films."
U.S. Supplemental Notice of Allowability dated Jan. 26, 2022, in U.S. Appl. No. 17/008,095.
Wang, et al., "Lithography Simulation for the Fabrication of Silicon Photonic Devices with Deep-Ultraviolet Lithography" IEEE, (2012) pp. 288-290.
Banerjee, D. et al., "Potential of Metal-Organic Frameworks for Separation of Xenon and Krypton", Accounts of Chemical Research, 2015, vol. 48, No. 2, pp. 211-219.
Cardineau, B. et al., "EUV Resists Based on Tin-oxo Clusters", Advances in Patterning Materials and Processes XXXI, Proceedings Of Spie, Apr. 4, 2014, vol. 9051, pp. 335-346.
CN Office Action dated Dec. 13, 2023 in CN Application No. 201810783756.6 with English translation.
CN Office Action dated Jun. 1, 2023, in application No. CN201810783756 with English translation.
CN Office Action dated Jun. 8, 2022 in Application No. CN202180002531.2 With English Translation.
CN Office Action dated Mar. 31, 2023, in Application No. CN201880046648.9 with English translation.
CN Office Action dated Nov. 16, 2022, in Application No. CN202180002531.2 with English translation.
CN Office Action dated Nov. 18, 2022, in Application No. CN201810783756.6 with English translation.
Dahuang, D., et al., Functional Thin Films and Their Deposition Preparation Techniques, Metallurgy Industrial Press, Jan. 31, 2013, pp. 450-454. [with English Translation].
Danilo D.E., et al., "Metal Containing Resist Readiness for HVM EUV Lithography", Journal of Photopolymer Science and Technology, 2016, vol. 29(3), pp. 501-507.
European Search Report dated Feb. 15, 2022, in Application No. EP21741104.
European Office Action dated Feb. 25, 2022 in Application No. 21741104.
Extended European Search Report dated Dec. 23, 2021, in Application No. EP19800353.5.
Gross, R.A. et al., "Biodegradable Polymers for the Environment", Science, Aug. 2, 2002, vol. 297, No. 5582, pp. 803-807.
Hamley, I.W., "Nanostructure fabrication using block copolymers", Nanotechnology. Sep. 17, 2003;14(10):R39-R54.
Harrisson, S. et al., "RAFT Polymerization of Vinyl Esters: Synthesis and Applications", Polymers, 2014, vol. 6, No. 5, pp. 1437-1488.
Hench, L.L. and West, J.K., "The sol-gel process," Chemical reviews, Jan. 1, 1990; 90(1) pp. 33-72.
International Preliminary Report on Patentability dated Oct. 13, 2022, in PCT Application No. PCT/US2021/023493.
International Preliminary Report on Patentability dated Oct. 13, 2022, in PCT Application No. PCT/US2021/025111.
International Search Report and Written Opinion dated Aug. 4, 2021, in PCT Application No. PCT/US2021/023493.
International Search Report and Written Opinion dated Jul. 20, 2021, in PCT Application No. PCT/US2021/025111.
International Search Report and Written Opinion dated Mar. 4, 2022, in Application No. PCT/US2021/058647.
International Search Report and Written Opinion dated Nov. 11, 2022 in PCT Application No. PCT/US2022/037733.

(56) References Cited

OTHER PUBLICATIONS

International Search Report and Written Opinion dated Oct. 8, 2020 in Application No. WO2020US38968.
International Preliminary Report on Patentability dated Jul. 1, 2021 issued in Application No. PCT/US2019/067540.
International Preliminary Report on Patentability dated May 27, 2021 issued in Application No. PCT/US2019/060742.
International Search Report and Written Opinion dated May 17, 2021 issued in Application No. PCT/US2021/015656.
International Preliminary Report on Patentability dated Apr. 14, 2022 issued in Application No. PCT/US2020/053856.
International Preliminary Report on Patentability dated Aug. 18, 2022 in PCT Application No. PCT/US2021/015656.
International Preliminary Report on Patentability dated Jan. 27, 2021 in Application PCT/US2020/054730.
International Preliminary Report on Patentability dated Jan. 5, 2023 in PCT Application No. PCT/US2021/034019.
International Preliminary Report on Patentability dated Jan. 5, 2023 in PCT Application No. PCT/US2021/037924.
International Preliminary Report on Patentability dated Jan. 19, 2023 in PCT Application No. PCT/US2021/040381.
International Preliminary Report on Patentability dated Jan. 26, 2023 in PCT Application No. PCT/US2021/042103.
International Preliminary Report on Patentability dated Jan. 26, 2023 in PCT Application No. PCT/US2021/042104.
International Preliminary Report on Patentability dated Jan. 26, 2023 in PCT Application No. PCT/US2021/042106.
International Preliminary Report on Patentability dated Jan. 26, 2023 in PCT Application No. PCT/US2021/042107.
International Preliminary Report on Patentability dated Jan. 26, 2023 in PCT Application No. PCT/US2021/042108.
International Preliminary Report on Patentability dated Jan. 6, 2022 in PCT Application No. PCT/US2020/038968.
International Preliminary Report on Patentability dated Jan. 6, 2022 in PCT Application No. PCT/US2020/039615.
International Preliminary Report on Patentability dated Jan. 6, 2022 in PCT Application No. PCT/US2020/070171.
International Preliminary Report on Patentability dated Jan. 6, 2022 in PCT Application No. PCT/US2020/070172.
International Preliminary Report on Patentability dated Jan. 6, 2022 in PCT Application No. PCT/US2020/070187.
International Preliminary Report on Patentability dated Jul. 28, 2022 in PCT Application No. PCT/US2021/012953.
International Preliminary Report on Patentability dated Nov. 11, 2021, for International Application No. PCT/US2020/028151.
International Preliminary Report on Patentability dated Sep. 9, 2022, in PCT Application No. PCT/US2021/019245.
International Search Report and Written Opinion dated May 12, 2021 issued in Application No. PCT/US2021/012953.
International Search Report and Written Opinion dated Apr. 10, 2020 issued in Application No. PCT/US2019/060742.
International Search Report and Written Opinion dated Apr. 24, 2020 issued in Application No. PCT/US2019/067540.
International Search Report and Written Opinion dated Aug. 22, 2019 issued in Application No. PCT/US2019/031618.
International Search Report and Written Opinion dated Jan. 27, 2021 issued in Application No. PCT/US2020/054730.
International Search Report and Written Opinion dated Jul. 31, 2020, in PCT Application No. PCT/US2020/028151.
International Search Report and Written Opinion dated Mar. 23, 2021 issued in Application No. PCT/US2020/053856.
International Search Report and Written Opinion dated Nov. 3, 2021, in PCT Application No. PCT/US2021/042108.
International Search Report and Written Opinion dated Nov. 4, 2021 in PCT Application No. PCT/US2021/042103.
International Search Report and Written Opinion dated Nov. 4, 2021 in PCT Application No. PCT/US2021/042106.
International Search Report and Written Opinion dated Nov. 4, 2021 in PCT Application No. PCT/US2021/042107.
International Search Report and Written Opinion dated Nov. 10, 2021, in PCT Application No. PCT/US2021/042104.
International Search Report and Written Opinion dated Oct. 13, 2021, in application No. PCT/US2021/037924.
International Search Report and Written Opinion dated Oct. 16, 2020 issued in Application No. PCT/US2020/039615.
International Search Report and Written Opinion dated Oct. 16, 2020 issued in Application No. PCT/US2020/070171.
International Search Report and Written Opinion dated Oct. 16, 2020 issued in Application No. PCT/US2020/070172.
International Search Report and Written Opinion dated Oct. 16, 2020 issued in Application No. PCT/US2020/070187.
International Search Report and Written Opinion dated Oct. 28, 2021 in PCT Application No. PCT/US2021/040381.
International Search Report and Written Opinion dated Oct. 8, 2020 issued in Application No. PCT/US2020/038968.
International Search Report and Written Opinion dated Sep. 15, 2021, in PCT Application No. PCT/US2021/034019.
Joo, W. et al., "Synthesis of Unzipping Polyester and a Study of its Photochemistry", Journal of the American Chemical Society, 2019, vol. 141, No. 37, pp. 14736-14741.
JP Office Action dated Jul. 26, 2022 in Application No. JP2021102822 With English translation.
JP Office Action dated Nov. 15, 2022, in Application No. JP2021-176082 with English translation.
JP Office Action dated Jun. 14, 2022, in Application No. JP20190563508 with English translation.
JP Office Action dated Sep. 5, 2023 in Application No. JP2022-202758 with English Translation.
Klepper, K.B. et al., "Atomic Layer Deposition of Organic-inorganic Hybrid Materials Based on Saturated Linear Carboxylic Acids", Dalton Transactions, May 7, 2011, vol. 40, No. 17, pp. 4337-4748.
KR Office Action dated Feb. 8, 2022, in Application No. KR10-2021-7030794 with English Translation.
KR Office Action dated May 9, 2022, in Application No. KR1020217030794 with English translation.
KR Office Action dated May 25, 2023, in application No. KR10-2019-7037210 with English translation.
KR Prior Art Search Report dated Apr. 3, 2023, in application No. KR 10-2022-7029421 with English translation.
Kwon, J., et al., "Substrate Selectivity of (tBu-Allyl)Co(C0)3 during Thermal Atomic Layer Deposition of Cobalt," Chemistry of Materials, Mar. 27, 2012; 24(6): pp. 1025-1030.
Lemaire, P.C., et al., "Understanding inherent substrate selectivity during atomic layer deposition: Effect of surface preparation, hydroxyl density, and metal oxide composition on nucleation mechanisms during tungsten ALD" The Journal of chemical physics, Feb. 7, 2017, 146(5):052811.
Lu, Y., et al., "Continuous formation of supported cubic and hexagonal mesoporous films by sol-gel dip-coating" Nature, Sep. 1997, 389(6649), pp. 364-368.
Mackus, A.J., et al. "The use of atomic layer deposition in advanced nanopatterning", Nanoscale. Jul. 25, 2014; 6(19):10941-60.
Mai, L. et al., "Atomic/molecular Layer Deposition of Hybrid Inorganic-organic Thin Films from Erbium Guanidinate Precursor", Journal of Materials Science, 2017, vol. 52, No. 11, pp. 6216-6224. https://doi.org/10.1007/s10853-017-0855-6.
Meng, X., "An Overview of Molecular Layer Deposition for Organic and Organic-inorganic Hybrid Materials: Mechanisms, Growth Characteristics, and Promising Applications", Journal of Materials Chemistry A, 2017, vol. 5, pp. 18326-18378.
Molloy, K. C., "Precursors for the Formation of Tin (IV) Oxide and Related Materials", Journal of Chemical Research, 2008, vol. 2008, No. 10, pp. 549-554.
Nazarov, D.V., et al., "Atomic layer deposition of tin dioxide nanofilms: A review", Rev. Adv. Mater. Sci. Jun. 1, 2015; 40(3):262-75.
Notice of Allowance dated Dec. 9, 2021 in U.S. Appl. No. 17/310,635.
Rantala, et al., "New resist and underlayer approaches toward EUV lithography," Proc. SPIE 10809, International Conference on Extreme Ultraviolet Lithography 2018, pp. 108090X-1-108090X-8. (Oct. 11, 2018).

(56) References Cited

OTHER PUBLICATIONS

Sundberg, p et al., "Organic and Inorganic-organic Thin Film Structures by Molecular Layer Deposition: A Review", Beilstein Journal of Nanotechnology, 2014, vol. 5, pp. 1104-1136.
TW Office Action dated Jan. 9, 2023 In Application No. TW20190116155 with English translation.
TW Office Action dated Sep. 5, 2022, in Application No. TW110101388 with English translation.
TW Office Action dated Sep. 8, 2022 in Application No. TW111123386 with English translation.
TW Office Action dated Apr. 29, 2022 in Application No. TW110118172 with English translation.
TW Office Action dated Aug. 9, 2023, in application No. TW109114280 with English Translation.
TW Office Action dated Jan. 13, 2023, in Application No. TW110124741 with English translation.
TW Office Action dated Jan. 19, 2023 in Application No. TW110141961 with English translation.
TW Office Action dated Jul. 10, 2023 in Application No. TW109108753 with English Translation.
TW Office Action dated Mar. 7, 2022, in Application No. TW110101388 with English translation.
U.S. Final Office Action dated May 12, 2023 in U.S. Appl. No. 17/455,185.
U.S. Final Office Action dated Nov. 9, 2023 in U.S. Appl. No. 17/455,185.
U.S. Non-Final office Action dated Feb. 7, 2023 in U.S. Appl. No. 17/455,185.
U.S. Non-Final Office Action dated Nov. 3, 2023, in U.S. Appl. No. 17/594,744.
U.S. Non-Final Office Action dated Oct. 20, 2023, in U.S. Appl. No. 18/297,989.
U.S. Non-Final Office Action dated Oct. 20, 2023, in U.S. Appl. No. 18/298,003.
U.S. Notice of Allowance dated Feb. 22, 2022 in U.S. Appl. No. 17/310,635.
U.S. Appl. No. 17/905,754, inventors Kanakasabapathy et al., filed Sep. 6, 2022.
U.S. Appl. No. 18/005,571 inventors Hansen et al., filed Jan. 13, 2023.
U.S. Appl. No. 18/005,594, inventors Hansen et al., filed Jan. 13, 2023.
U.S. Appl. No. 18/298,003, inventors Marks et al., filed Apr. 10, 2023.
U.S. Restriction Requirement dated Nov. 14, 2022 in U.S. Appl. No. 17/455,185.
U.S. Restriction requirement dated Aug. 4, 2023, in U.S. Appl. No. 18/297,989.
U.S Restriction requirement dated Aug. 18, 2023 in U.S. Appl. No. 18/298,003.
Xu, et al., "Underlayer designs to enhance the performance of EUV resists," Proceedings of SPIE, vol. 7273, 2009, pp. 727311-1-727311-11.
Yoon, K. et al., "Fabrication of a New Type of Organic-inorganic Hybrid Superlattice Films Combined With Titanium Oxide and Polydiacetylene", Nanoscale Research Letters, Jan. 5, 2012, vol. 7, No. 71, 6 pages.
Zhou, H. et al., "Molecular Layer Deposition of Functional Thin Films for Advanced Lithographic Patterning", ACS Applied Materials & Interfaces, 2011, vol. 3, No. 2, pp. 505-511.
CN Office Action dated Mar. 14, 2024 in CN Application No. 201810783756.6, with English Translation.
International Search Report and Written Opinion dated Jun. 10, 2024 in PCT Application No. PCT/US2024/013598.
JP Office Action dated Mar. 12, 2024 in JP Application No. 2022-202758, with English Translation.
KR Office Action dated Apr. 23, 2024 in KR Application No. 10-2016-0152489 with English translation.
U.S. Advisory Action dated May 7, 2024 in U.S. Appl. No. 18/298,003.
U.S. Final Office Action dated Feb. 27, 2024 in U.S. Appl. No. 18/298,003.
U.S. Final Office Action dated May 3, 2024 in U.S. Appl. No. 18/297,989.
U.S. Non-Final Office Action dated May 29, 2024 in U.S. Appl. No. 18/298,003.
U.S. Notice of Allowance dated Mar. 27, 2024 in U.S. Appl. No. 17/594,744.
CN Office Action dated Jul. 23, 2024 in CN Application No. 201810783756.6 with English translation.
CN Office Action dated Jun. 28, 2024 in CN Application No. 202080032750 with English translation.
KR Office Action dated Jun. 28, 2024 in KR Application No. 10-2021-7033470, with English Translation.
TW Office Action dated Jul. 23, 2024 in TW Application No. 110111878, with English Translation.
U.S. Corrected Notice of Allowance dated Jul. 8, 2024 in U.S. Appl. No. 17/594,744.
U.S. Non-Final Office Action dated Aug. 7, 2024 in U.S. Appl. No. 17/759,896.
U.S. Non-Final Office Action dated Jul. 15, 2024 in U.S. Appl. No. 17/645,939.

\* cited by examiner

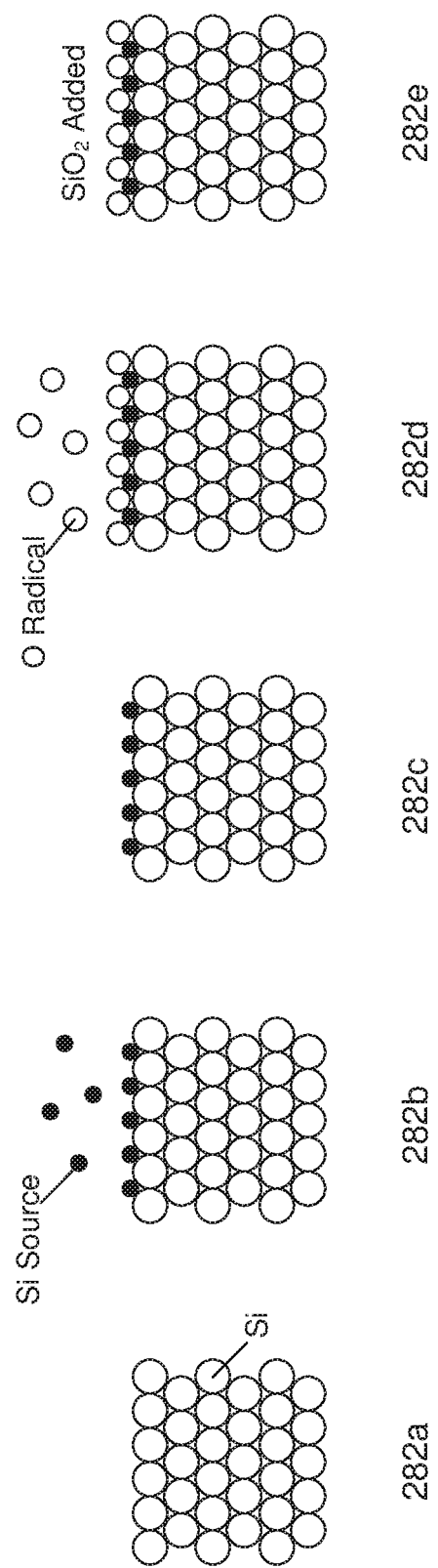

REDUCING ROUGHNESS OF EXTREME ULTRAVIOLET LITHOGRAPHY RESISTS

INCORPORATED BY REFERENCE

PCT Request Form is filed concurrently with this specification as part of the present application. Each application that the present application claims benefit of or priority to as identified in the concurrently filed PCT Request Form is incorporated by reference herein in its entirety and for all purposes.

BACKGROUND

Patterning of thin films is often a critical step in the fabrication of micro- and nanoscale devices, such as in semiconductor processing for the fabrication of semiconductor devices. Patterning involves lithography. In conventional photolithography, such as 193 nm photolithography, patterns are printed by emitting photons from a photon source onto a mask and printing the pattern onto a photosensitive photoresist, thereby causing a chemical reaction in the photoresist that, after development, removes certain portions of the photoresist to form the pattern.

Advanced technology nodes (as defined by the International Technology Roadmap for Semiconductors) include nodes 22 nm, 16 nm, and beyond. In the 16 nm node, for example, the width of a typical via or line in a Damascene structure is typically no greater than about 30 nm. Scaling of features on advanced semiconductor integrated circuits (ICs) and other devices is driving lithography to improve resolution.

Extreme Ultraviolet (EUV) lithography operates on a 30 nm scale with a different light source and photoresist materials. EUV lithography can cause two types of roughness in the photoresist: high frequency roughness caused by stochastic effects from secondary electrons, and low frequency roughness (also known as "wiggling.") due to the interactions among the size, geometry and mechanical properties of the resist materials. Both types of roughness are undesirable.

SUMMARY

Disclosed herein are methods and apparatuses for reducing roughness of an EUV resist. Roughness is reduced by decreasing the compressive stress of the resist layer. This may be done by depositing a conformal thin film that has a less compressive, or even tensile, stress than the resist. The resulting composite stress reduces the buckling and/or bulging, and thus decreases low frequency roughness.

In one aspect of the embodiments disclosed herein, a method of reducing the roughness of an EUV resist is provided, the method including: providing to a process chamber a substrate including a patterned EUV resist having a first stress level; and depositing on the patterned EUV resist a conformal thin film having a second stress level that is less compressive than the first stress level, such that a third stress level of the patterned EUV resist resulting from the depositing of the conformal thin film is less compressive than the first stress level.

In various implementations, the substrate is a semiconductor wafer including a partially fabricated semiconductor device. In some embodiments, the conformal thin film has a thickness of no more than 2 nm. In other embodiments, the conformal thin film has a thickness of about 1 nm.

In some implementations, the conformal thin film second stress level is tensile. In other implementations, the conformal thin film second stress level is compressive.

In various embodiments, the patterned EUV resist is characterized by a line roughness that is decreased after the depositing. In some embodiments, the line roughness comprises one or more of line edge roughness (LER) and line width roughness (LWR). In various implementations, the line roughness is a low frequency line roughness. In some implementations, the low frequency line roughness has a spatial frequency of less than 0.05 $nm^{-1}$. In some embodiments, the line roughness is a high frequency line roughness. In various embodiments, the high frequency line roughness has a spatial frequency of greater than 0.05 $nm^{-1}$.

In some implementations, the conformal thin film comprises a Si-based dielectric. In various implementations, the dielectric is $SiO_2$. In certain implementations, conformal thin film is deposited by ALD. In some implementations, the ALD includes plasma enhanced ALD, wherein a cycle includes flowing an oxygen plasma with a power between 10 W and 2500 W and a duty cycle between 25% and 50%.

In some embodiments, the EUV resist includes a chemically amplified resist (CAR), an organo-metal, or an organometal oxide. In various embodiments, the organo-metal oxide is an organo-tin oxide.

In some implementations, the line edge roughness decreases by an amplitude of from about 0.1 to 1 $nm^4$ (PSD). In certain implementations, the method also includes etching the substrate layer in the process chamber after the depositing of the conformal thin film.

In another aspect of the embodiments herein, an apparatus for processing substrates is provided, the apparatus including: one or more process chambers, each process chamber comprising a substrate support; one or more gas inlets into the process chambers and associated flow-control hardware; one or more substrate handlers; and a controller having at least one processor and a memory, wherein the at least one processor and the memory are communicatively connected with one another, the at least one processor is at least operatively connected with the one or more substrate handlers and the flow-control hardware, and the memory stores computer-executable instructions for controlling the at least one processor to at least control the one or more substrate handlers and the flow-control hardware to: provide to a process chamber a substrate including a patterned EUV resist disposed on a substrate layer to be etched, the patterned EUV resist having a first stress level; and deposit on the patterned EUV resist a conformal thin film having a second stress level that is less compressive than the first stress level, such that a third stress level of the patterned EUV resist resulting from the depositing of the conformal thin film is less compressive than the first stress level.

These and other features of the disclosed embodiments will be described in detail below with reference to the associated drawings.

BRIEF DESCRIPTION OF DRAWINGS

FIG. 2 is a schematic illustration of an embodiment of atomic layer deposition.

DETAILED DESCRIPTION

In the following description, numerous specific details are set forth to provide a thorough understanding of the presented embodiments. Embodiments disclosed herein may be practiced without some or all of these specific details. In other instances, well-known process operations have not been described in detail to not unnecessarily obscure the disclosed embodiments. Further, while the disclosed embodiments will be described in conjunction with specific embodiments, it will be understood that the specific embodiments are not intended to limit the disclosed embodiments.

Extreme Ultraviolet (EUV) lithography finds use in semiconductor fabrication at the 30 nm and below technology nodes. Reducing (e.g., minimizing) roughness of the resist and the resulting etch can improve process yield and device performance at increasingly smaller critical dimensions. Roughness may be measured by line edge roughness (LER) and line width roughness (LWR) of the resist and the resulting etch. Reducing (e.g., minimizing) both LER and LWR can enhance the results of the EUV lithography etch process.

Figure 4:
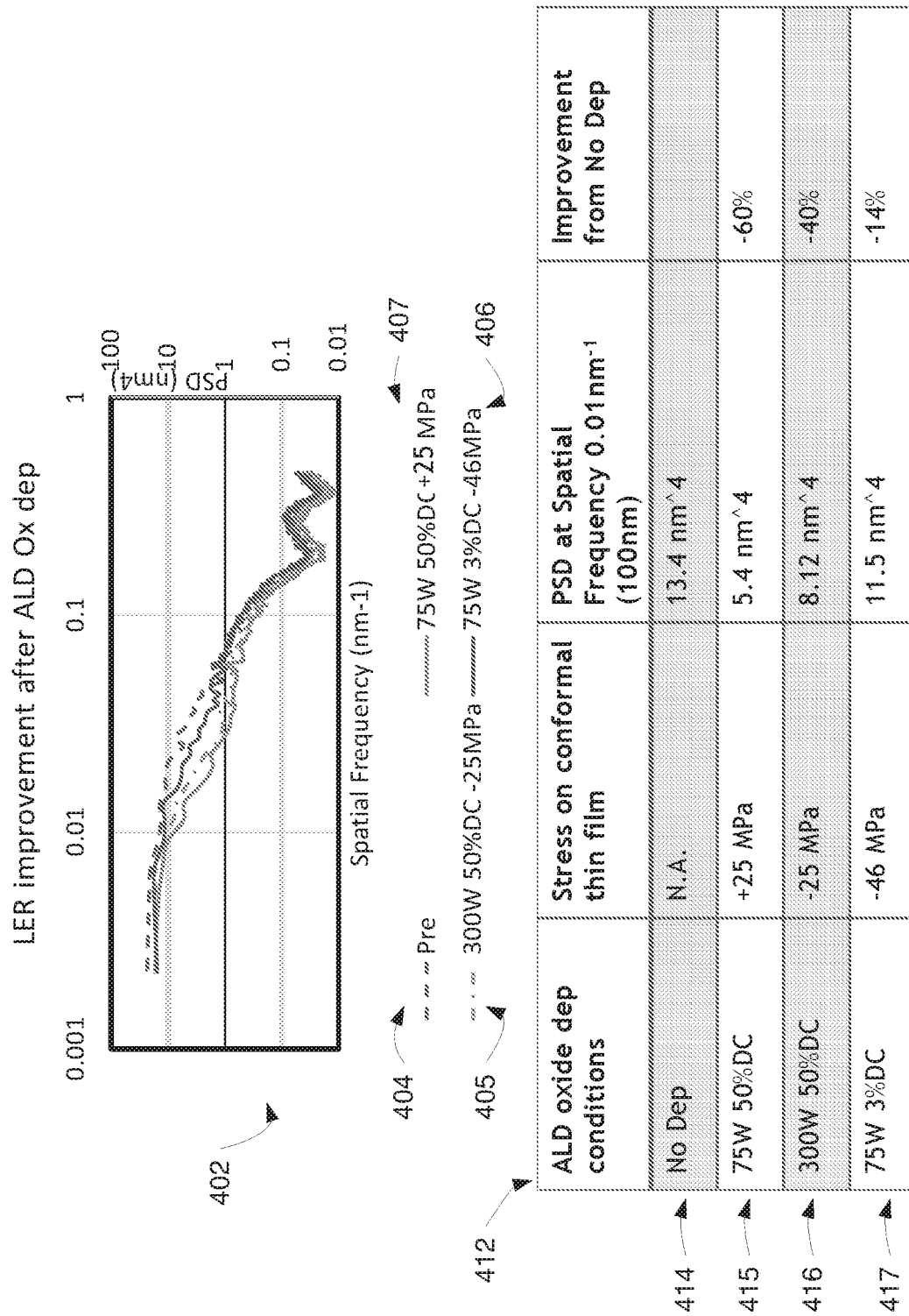
FIG. 4 is a data plot showing the effects of various conformal thin films on LER

Roughness can have high and low frequency components, and these components can be represented using a power spectral density (PSD) curve. FIG. 4 has a PSD curve 402 that is representative. PSD curves are typically plotted on a log-log plot. The horizontal axis represents the spatial frequency of the roughness (which is also the inverse of the wavelength of the roughness, i.e. 0.01 $nm^{-1}$=100 nm), and the vertical axis is the PSD value, which linearly correlates with LER or LWR. The area under the PSD curve represents the total variance, and ideally should be minimized for any etch process.

EUV lithography resists post exposure have two general categories of roughness: low frequency and high frequency. High frequency roughness is characterized by short variations in the resist and may be caused by a variety of factors, including the secondary electron that is emitted inherently in the EUV lithography process. This is the area to the right on the PSD curve 402, at about 0.1 $nm^{-1}$ or higher. Low frequency roughness is longer wavelength variation in the resist, and is shown on the left part of PSD curve 402, at about 0.01 $nm^{-1}$ or lower. One cause of low frequency roughness is compressive stress within the resist. Compressive stress within the resist causes it to buckle and/or bulge, creating low frequency roughness, sometimes referred to as "wiggling."

Some solutions to reducing resist roughness include plasma treatment, carbon based deposition, silicon-oxide based deposition, and etch by-product deposition. Each of these processes has various drawbacks. Plasma treatment may reduce roughness by reflowing the resist, but also reduces the resist height and selectivity. Carbon based deposition may cause clogging at the top of the mask, interfering with the etch process. Conventional silicon-oxide based deposition is selective at high aspect ratios, affecting the critical dimension and potentially causing line breakage or merging. Etch by-product may reduce selectivity of the etch process and prevent successful transfer of the resist pattern. In addition to the various drawbacks of each approach, all of them only address high frequency roughness.

An alternative approach to reduce roughness is reducing the compressive stress within the resist layer. This may be done by depositing a conformal thin film that has a less compressive, or even tensile, stress than the resist. The resulting composite stress reduces the buckling and/or bulging, and thus decreases low frequency roughness.

The conformal thin film may be deposited by a plasma enhanced atomic layer deposition (ALD) process. By modulating the $O_2$ plasma during the ALD process the internal stress of the conformal thin film can be altered to be less compressive/more tensile. The resulting composite resist/oxide layer has a resulting composite stress that is less compressive, and has reduced buckling and/or bulging. The conformal thin film may be 1-2 nm thick in some embodiments while still improving low frequency roughness.

Figure 1:
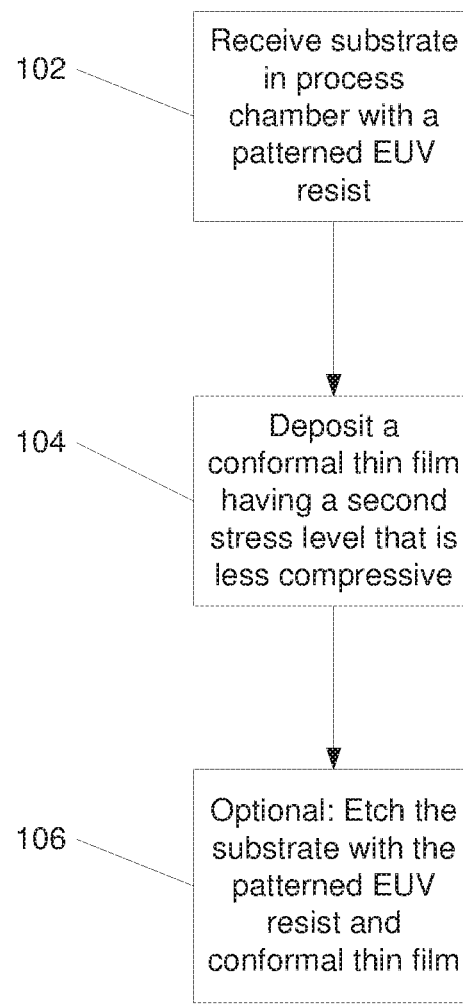
FIG. 1 is a process flow diagram depicting operations for a method in accordance with the disclosed embodiments.

FIG. 1 provides a process flow diagram for performing operations of a method in accordance with disclosed embodiments. Operations in FIG. 1 may be performed at, for example, a chamber pressure between about 1 mTorr and about 100 Torr, e.g., about 1 mTorr and about 1 Torr. The method shown in FIG. 1 generally relates to conducting a deposition on a semiconductor substrate. Specifically, in operation 102, a semiconductor substrate composed of, or otherwise comprising, a plurality of distinct substrate materials, including a patterned EUV resist layer, is provided to a processing chamber.

The patterned EUV resist layer may be made of a variety of materials. In some embodiments the patterned EUV resist layer may be made of organic or inorganic metal oxide-containing films, such as organotin oxides, such as are available from Inpria Corp., or traditional chemically amplified resists from Dow/Rohm, Fujifilm and Shin-Etsu Polymer. The patterned EUV resists may also comprise chemically amplified resists. The patterned EUV resist layer may be 30-40 nm thick, for example.

Referring to the chamber in which the semiconductor substrate is provided in operation 102, the chamber may be in a multi-chamber apparatus or a single-chamber apparatus. The semiconductor substrate may be a silicon wafer, e.g., a 200-mm wafer, a 300-mm wafer, or a 450-mm wafer, including wafers having one or more layers of material, such as dielectric, conducting, or semi-conducting material, deposited thereon. In some embodiments, the semiconductor substrate includes a blanket layer of silicon, such as amorphous silicon, or a blanket layer of germanium.

In some embodiments, the layers on the substrate may be patterned. Substrates may have "features" such as via or contact holes, which may be characterized by one or more of narrow and/or reentrant openings, constrictions within the feature, or high aspect ratios. The feature may be formed in one or more of the above described layers. One example of a feature is a hole or via in a semiconductor substrate or a layer on the substrate. Another example is a trench in a substrate or layer. In various embodiments, the feature may have an under-layer, such as a barrier layer or adhesion layer. Non-limiting examples of under-layers include dielectric layers and conducting layers, silicon oxides, silicon nitrides, silicon carbides, metal oxides, metal nitrides, metal carbides, and metal layers.

At operation 104 a conformal thin film is deposited onto the semiconductor substrate. The conformal thin film may comprise a variety of materials. In some embodiments the conformal thin film is silicon oxide. In other embodiments the conformal thin film may be silicon nitride. The conformal thin film may also be made of carbon based oxides. In various embodiments the conformal thin film is made of a material that will not be removed during a subsequent etch of the substrate. The conformal thin film may be less than 3 nm thick, less than 2 nm thick, 1-2 nm thick, or about 2 nm thick. The thickness is insufficient to adversely affect the critical dimension of the features being fabricated. By varying the conditions of the deposition, the conformal thin film can be designed to have different levels of internal stress. In some embodiments, the conformal thin film has an internal tensile stress. In other embodiments, the conformal thin film has a lower compressive stress than that of the patterned EUV resist.

In some embodiments the conformal thin film may be deposited by plasma enhanced ALD. Generally, ALD is a technique that deposits thin layers of material using sequential self-limiting reactions. ALD may be performed using any suitable technique. In various embodiments, ALD may be performed with plasma, or may be performed thermally. Also, operation 104 may be performed in cycles, i.e. referred to herein as an "ALD cycle."

Referring to FIG. 2, a schematic illustration of a thin film is deposited on a substrate by ALD is shown. In various embodiments, a silicon-containing film is deposited, for example silicon oxide (e.g., $SiO_2$), silicon oxynitride or silicon nitride. ALL) is a technique that deposits thin layers of material using sequential self-limiting reactions. ALD may be performed using any suitable technique. In various embodiments, ALD may be performed with plasma, or may be performed thermally, and may be performed in cycles.

The concept of an "ALD cycle" is relevant to the discussion of various embodiments herein. Generally an ALD cycle is the minimum set of operations used to perform a surface deposition reaction one time. The result of one cycle is production of at least a partial silicon-containing film layer on a substrate surface, such as the semiconductor substrate material of operation 104. Typically, an ALD cycle includes operations to deliver and adsorb at least one reactant to the substrate surface, and then react the adsorbed reactant with one or more reactants to form the partial layer of film. The cycle may include certain ancillary operations such as sweeping one of the reactants or byproducts and/or treating the partial film as deposited. Generally, a cycle contains one instance of a unique sequence of operations. As an example, an ALD cycle may include the following operations: (i) delivery/adsorption of a silicon-containing precursor, (ii) purging of silicon-containing precursor from the chamber, (iii) delivery of a second reactant (e.g., an oxidant) and a plasma, and (iv) purging of plasma from the chamber.

In accordance with this disclosure, mid-batch conditioning purging may be used at appropriate intervals between ALD cycles to increase batch sizes. According to various embodiments, the deposition/mid-bath conditioning purge cycles may be repeated throughout the batch until the maximum accumulation limit is reached.

FIG. 2 shows an example schematic illustration of an ALD cycle for depositing silicon Oxide ($SiO_2$). Diagrams 282a-282e show a generic ALD cycle. In 282a, a silicon substrate is provided, which includes many silicon atoms. In 282b, a silicon-containing precursor or silicon source, is introduced to the substrate, and some silicon atoms adsorb on the substrate. In 282c, un-adsorbed silicon-containing precursor or silicon source are purged from the chamber. In 282d, oxygen is introduced as oxygen radicals and the adsorbed silicon reacts with the oxygen radicals on the surface of the substrate to form a $SO_2$ film. In 282e, the chamber is purged and the byproducts are removed, leaving behind a deposited layer of $SiO_2$.

In some embodiments, the films deposited by ALD may be highly conformal. Conformality of films may be measured by the step coverage. Step coverage may be calculated by comparing the average thickness of a deposited film on a bottom, sidewall, or top of a feature to the average thickness of a deposited film on a bottom, sidewall, or top of a feature. For example, step coverage may be calculated by dividing the average thickness of the deposited film on the sidewall by the average thickness of the deposited film at the top of the feature and multiplying it by 100 to obtain a percentage.

Unlike a chemical vapor deposition (CVD) technique, ALD processes use surface-mediated deposition reactions to deposit films on a layer-by-layer basis. In one example of an ALD process, a substrate surface, including a population of surface active sites, is exposed to a gas phase distribution of a first precursor, such as a silicon-containing precursor, in a dose provided to a process chamber housing the substrate. Molecules of this first precursor are adsorbed onto the substrate surface, including chemisorbed species and/or physisorbed molecules of the first precursor. It should be understood that when the compound is adsorbed onto the substrate surface as described herein, the adsorbed layer may include the compound as well as derivatives of the compound. For example, an adsorbed layer of a silicon-containing precursor may include the silicon-containing precursor as well as derivatives of the silicon-containing precursor. In certain embodiments, an ALD precursor dose partially saturates the substrate surface. In some embodiments, the dose phase of an ALD cycle concludes before precursor contacts the substrate to evenly saturate the surface. Typically, the precursor flow is turned off or diverted at this point, and only purge gas flows. By operating in this sub-saturation regime, the ALD process reduces the cycle titre and increases throughput. However, because precursor adsorption is not saturation limited, the adsorbed precursor concentration may vary slightly across the substrate surface. Examples of ALD processes operating in the sub-saturation regime are provided in U.S. patent application Ser. No. 14/061,587, filed Oct. 23, 2013, titled "SUB-SATURATED ATOMIC LAYER DEPOSITION AND CONFORMAL FILM DEPOSITION," which is incorporated herein by reference in its entirety, After a first precursor dose, the reactor is then evacuated to remove any first precursor remaining in gas phase so that only the adsorbed species remain. A second reactant, such as an oxygen or nitrogen-containing gas, is introduced to the reactor so that some of these molecules react with the first precursor adsorbed on the surface. In some processes, the second precursor reacts immediately with the adsorbed first precursor. In other embodiments, the second precursor reacts only after a source of activation is applied temporally. The reactor may then be evacuated again to remove unbound second precursor molecules. Additional ALD cycles may be used to build film thickness.

In some implementations, the ALD methods include plasma activation, such as when the second reactant is delivered to a chamber. As described herein, the ALD method and apparatuses described herein may be conformal film deposition (CFD) methods, which are described generally in U.S. patent application Ser. No. 13/084,399 (now U.S. Pat. No. 8,728,956), filed Apr. 11, 2011, and titled "PLASMA ACTIVATED CONFORMAL FILM DEPOSITION," and in U.S. patent application Ser. No. 13/084,305, filed Apr. 11, 2011, and titled "SILICON NITRIDE FILMS AND METHODS," which are herein incorporated by reference in its entireties. Additional examples of ALD processes are described in Puurunen, "Surface chemistry of atomic layer deposition: for the trimethylaluminum/water process", 97 J. Applied Physics 12301 (2005), which is herein incorporated by reference for the purpose of providing description for suitable ALD processes.

In some embodiments, a carrier gas, such as $N_2$, Ar, Ne, He, and combinations thereof, may be continuously flowed. The carrier gas may be used as a purge gas. The inert gas may be provided to assist with pressure and/or temperature control of the process chamber, evaporation of a liquid reactant, more rapid delivery of the reactant and/or as a sweep gas for removing process gases from the process chamber and/or process chamber plumbing.

In an adsorption operation of an ALD cycle, the substrate may be exposed to a film precursor, such as silicon tetrachloride ($SiCl_4$) or an aminosilane, to adsorb onto the substrate surface. In some embodiments, the film precursor may be a silicon-containing precursor. In some embodiments the film precursor is bis(tertiary-butyl-amino)silane (BTBAS). In some embodiments, the film precursor, such as $SiCl_4$, may be adsorbed onto about 60% of the substrate surface. In various embodiments, when the film precursor is flowed to the chamber, the film precursor adsorbs onto active sites on the surface of the substrate, forming a thin layer of the film precursor on the surface. In various embodiments, this layer may be less than a monolayer.

After adsorption, the chamber may be optionally purged to remove excess precursor in gas phase that did not adsorb onto the surface of the substrate. Purging may involve a sweep gas, which may be a carrier gas used in other operations or a different gas. In some embodiments, purging may involve evacuating the chamber.

In a second reactant delivery operation of an ALD cycle, the substrate may be exposed to a second reactant and, optionally, a plasma. In various embodiments, the second reactant is oxygen ($O_2$) or nitrogen ($N_2$) or combinations thereof. In some embodiments where a silicon oxide layer is deposited, oxygen is used as the second reactant. In some embodiments, second reactant flow and the plasma are both turned on. In some embodiments, second reactant flow may be turned on prior to turning on the plasma to, for example, allow the second reactant flow to stabilize.

In some embodiments, the optional plasma is an in-situ plasma, such that the plasma is formed directly above the substrate surface in the chamber. In various embodiments, the plasma may be an inductively coupled plasma or a capacitively coupled plasma. An inductively coupled plasma may be set at a plasma between about 50 W and about 2000 W. In some embodiments, the plasma may be turned on and off according to duty cycles (DC), where the plasma power is cycled on and off. In some embodiments, the duty cycle could vary between 25% and 50%, meaning the plasma is turned on between 25% and 50% of the operation time. In some embodiments, a bias may be applied between about 0V and about 500V. During delivery of the second reactant, the film precursor, such as $SiCl_4$, is turned off. The substrate may be exposed to the second reactant and the optional plasma for a duration that exceeds a time for plasma to interact with all precursors adsorbed on the substrate surface, forming a continuous film atop the substrate surface.

After the second reactant delivery operation, the chamber may be purged, such as by introducing a carrier or inert gas. Conditions for this operation may be any of those described above for purge processes.

In various embodiments, ALD cycles may be repeated. For example, operations for ALD may be performed for about 5 to about 70 cycles. Any suitable number of deposition cycles may be included to deposit a desired film thickness of the deposited film. In some embodiments, an ALD cycle may deposit about 1 Å per cycle. Depending on the exposure time of the operations, each cycle may deposit a film, such as a silicon oxide or silicon oxynitride film, having a thickness between about 0.05 Å and about 5 Å. In some embodiments, about two to about three cycles of ALD may be performed per minute. In some embodiments, more than about three cycles may be performed per minute, such as in chambers with inlets positioned to be closer to the substrate.

Returning to FIG. 1, at operation 106 the substrate is optionally etched. In some embodiments, etching the substrate underlying the patterned EUV resist follows the EUV resist patterning, as described above. The etching can occur immediately following the EUV resist patterning, in the same chamber, and without breaking vacuum. The patterned EUV resist and conformal thin film act as a mask to the substrate, such that areas covered by the patterned EUV resist are not etched. The conformal thin film may have a lower etch rate than the substrate material to ensure it remains on the patterned EUV resist throughout the etch process. Due to the more tensile stress of the conformal thin film, the patterned EUV resist and conformal thin film layer have reduced LER and/or LWR, which also reduces the LER and LWR of the etched substrate underneath.

Example process conditions for depositing a conformal thin film as shown in FIG. 1 are provided in the table below:

|  | First Reactant | Second Reactant |
| --- | --- | --- |
| Pressure | 1 mT to 100 Torr | 1 mT to 100 Torr |
| Power | 0 W | 10 to 2500 W |
| Bias | 0 V | 0 V to 50 V |
| Temp | −10 C. to 200 C. | −10 C. to 200 C. |
| Time | 0.5 s to 4 s | 0.5 to 4 s |
| Flow | 50 sccm to 5000 sccm | 50 sccm to 5000 sccm |

Figure 3A:
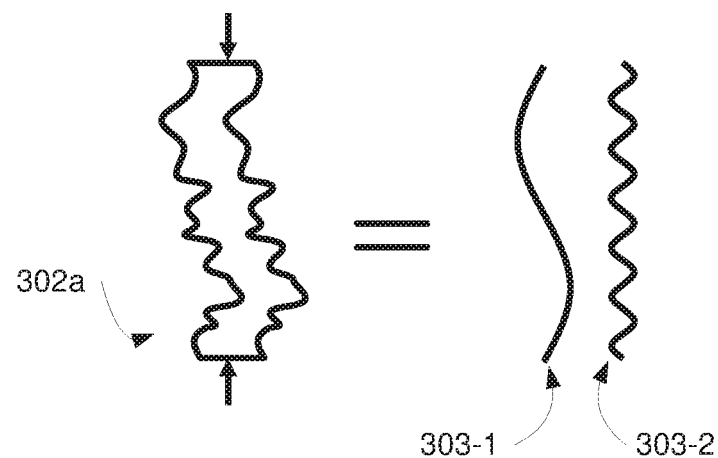
FIG. 3A is an illustration of high and low frequency roughness.
Figure 3B:
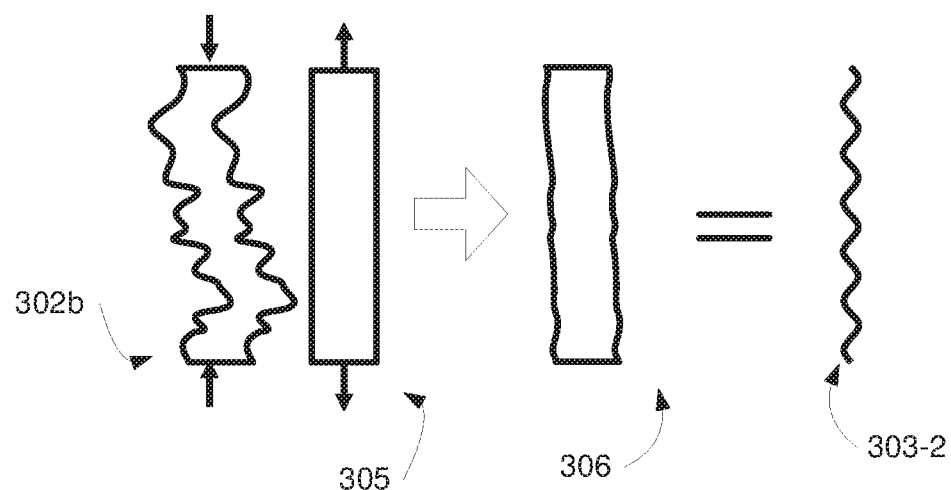
FIG. 3B is an illustration of reducing high frequency roughness by use of an embodiment disclosed herein.

FIGS. 3A and 3B are illustrations of roughness with and without a conformal thin film layer as described herein. In FIG. 3A, resist 302a is an illustration of part of a resist that may be developed on a semiconductor substrate. Resist 302a has a compressive internal stress, which causes buckling of the resist and thus increased LER and LWR. Resist 302a can be represented by low frequency roughness 303-1 and high frequency roughness 303-2, which respectively represent two types of roughness of resist 302a. Low frequency roughness 303-1 is caused in part by the compressive stress of resist 302a, which causes buckling and/or bulging.

FIG. 3B is an illustration of an EUV resist according to an embodiment disclosed herein. Resist 302b has a conformal thin film 305 deposited on it. Conformal thin film 305 is characterized by a tensile stress or a less compressive stress than the resist 302b, and the addition of conformal thin film 305 results in composite resist 306, which has less compressive stress than resist 302b. Due to the reduced compressive stress, composite resist 306 has reduced low frequency roughness.

In some embodiments conformal thin film 305 is silicon oxide deposited using plasma enhanced ALD. Alterations to the plasma enhanced ALD process can deposit a thin film that has varying levels of internal stress, from compressive to tensile. By depositing a thin film that has less compressive stress than the resist, the thin film counteracts the compressive stress of the resist and reduces the buckling and/or bulging that may occur, resulting in less low frequency roughness. In other embodiments a different dielectric material may be used, so long as it has a less compressive stress than the resist.

FIG. 4 is a graph and chart showing the effects of conformal thin films deposited on an EUV resist under varying ALD conditions for an example in accordance with this disclosure. Graph 402 shows the power spectral density (PSD) curves of four different deposition conditions. As PSD values directly correlate with line edge roughness (LER), a lower PSD value also means less LER. Line 404 is the PSD of the EUV resist without any treatment. Line 405 is the PSD of the EUV resist after depositing a conformal thin film made of silicon oxide at 300 W 50% DC. Line 406 is the PSD of the EUV resist after depositing a conformal thin film made of silicon oxide at 75 W 3% DC. Line 407 is the PSD of the EUV resist after depositing a conformal thin film made of silicon oxide at 75 W 50% DC. As graph 402 demonstrates, line 404 has the largest PSD values with no conformal thin film, while lines 405-407 demonstrate improved PSD values. The table below shows the process conditions for the reactants in the ALD cycle for each conformal thin film in this example. The process conditions for the first reactant for each conformal thin film was the same across all conformal thin films, while the process conditions for the second reactant varied.

| | First Reactant (Same for all) | Second Reactant 75 W 50% DC | Second Reactant 300 W 50% DC | Second Reactant 75 W 3% DC |
|---|---|---|---|---|
| Pressure | 90 mT | 30 mT | 30 mT | 30 mT |
| Power | 0 W | 75 W 50% DC | 300 W 50% DC | 75 W 3% DC |
| Bias | 0 V | 0 V | 0 V | 0 V |
| Temp | 60 C. | 60 C. | 60 C. | 60 C. |
| Time | 1 s | 1.5 s | 1.5 s | 1.5 s |
| Flow | 50 µL/min BTBAS, 500 sccm He | 200 sccm $O_2$, 1000 sccm He, 1000 sccm Ar | 200 sccm $O_2$, 1000 sccm He, 1000 sccm Ar | 200 sccm $O_2$, 1000 sccm He, 1000 sccm Ar |
| Cycle number | 10 | 10 | 10 | 10 |
| Thickness | N/A | 1.3 nm | 1.3 nm | 0.9 nm |

Chart 412 provides additional information related to graph 402. Rows 414-417 demonstrate the correlation between process conditions, internal thin film stress, and PSD values at a spatial frequency of 0.01 $nm^{-1}$. Roughness with a spatial frequency of 0.01 $nm^{-1}$ is considered a low frequency roughness, and thus lower PSD values at this spatial frequency generally correlate with reduced low frequency roughness. Row 414 correlates with line 404, showing data for the EUV resist without any conformal thin film, with a PSD value of 13.4 $nm^4$. Row 415 correlates with line 405, showing data for a conformal thin film deposited on the EUV resist at 75 W 50% DC, which had an internal stress of +25 MPa (Positive numbers are tensile stress, while negative numbers denote compressive stress) and a resulting PSD value of 5.4 $nm^4$, a 60% improvement over the PSD value of the EUV resist without the conformal thin film. Row 416 correlates with line 406, showing data for a conformal thin film deposited on the EUV resist at 300 W 50% DC, which had an internal stress of −25 MPa and a resulting PSD value of 8.12 $nm^4$, a 40% improvement. Finally, row 417 correlates with line 407, showing data for a conformal thin film deposited on the EUV resist at 75 W 3% DC, which had an internal stress of −46 MPa and a PSD value of 11.5 $nm^4$, marking a 14% improvement over the original PSD value of the EUV resist without a conformal thin film.

As is clear from the graph and chart, the EUV resist with a conformal thin film having the greatest tensile stress had the lowest PSD value, and therefore lowest LER. EUV resists without any conformal thin film or a conformal thin film with less tensile stress had larger PSD values, and hence greater LER.

Figure 5:
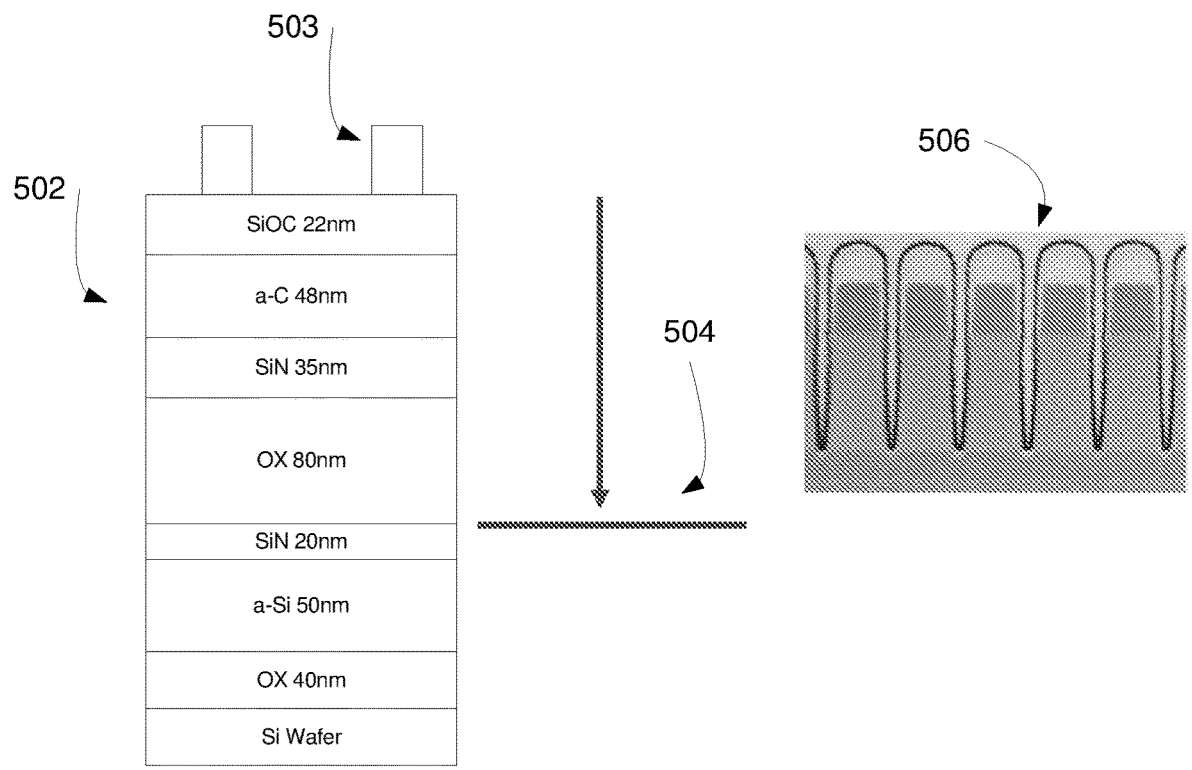
FIG. 5 is a diagram showing the layers etched using the embodiments herein.

FIG. 5 is an illustration of one application for EUV resists. Stack 502 is a series of substrate layers with an EUV resist 503 on top. The EUV resist is patterned, such that during an etch process features are formed in the substrate layers. The features are etched to a depth 504, which in this example is about 185 nm, but the feature depth could be larger or smaller. As the feature is etched through the layers, the roughness of the EUV resist will affect the roughness of the etched layers. Image 506 represents an image of etched features in a substrate, where each feature has variations. By improving the roughness of the EUV resist, the roughness of the etched features will also be improved.

Figure 6:
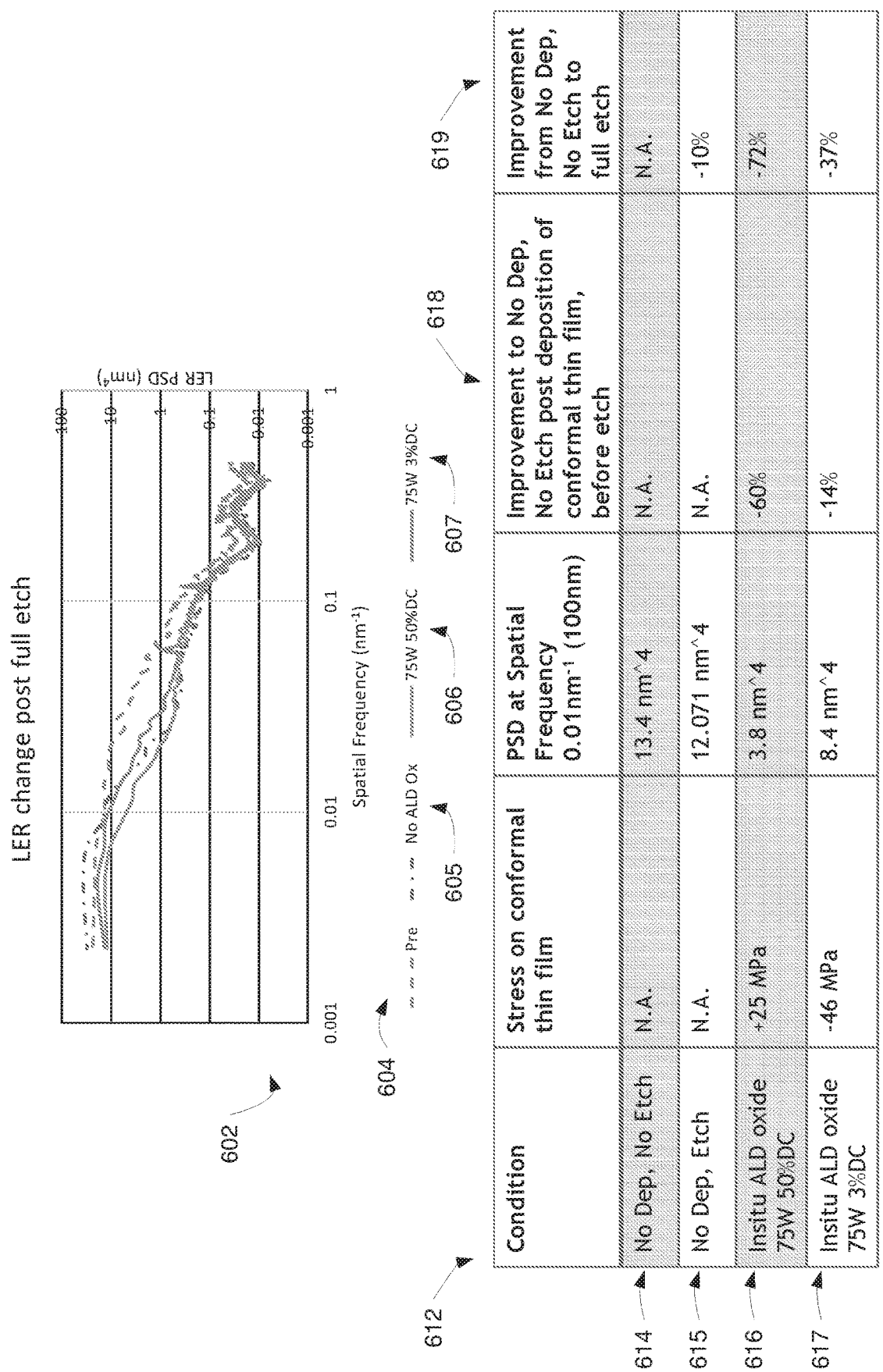
FIG. 6 is a data plot showing the effects of various conformal thin films on LER after etching.

FIG. 6 is a graph and a table showing the effects of films deposited under varying ALD conditions on LER of a target layer. Graph 602 shows the PSD curves under four different conditions. As PSD values directly correlate with LER, a lower PSD value also means less LER. Line 604 is the PSD of the EUV resist layer without a conformal thin film and before etching the substrate. Line 605 is the PSD of the target layer after etching with an EUV resist not having a conformal thin film. Line 606 is the PSD of the target layer after etching using an EUV resist having a conformal thin film made of silicon oxide at 75 W 50% DC. Line 607 is the PSD of the target layer after etching using an EUV resist having a conformal thin film made of silicon oxide at 75 W 3% DC after etching the substrate. As the chart demonstrates, line 604 has the largest PSD values with no conformal thin film, while lines 605-607 demonstrate improved PSD values. The two conformal thin films were deposited under the same or similar process conditions as shown in FIG. 4, above.

Chart 612 provides additional information related to graph 602. Rows 614-617 provide stress, PSD values at a spatial frequency of 0.01 $nm^{-1}$, and percentage improvement of the PSD value before etching, and percentage improvement of the PSD value after etching. Roughness with a spatial frequency of 0.01 $nm^{-1}$ is considered a low frequency roughness, and thus lower PSD values at this spatial frequency generally correlate with reduced low frequency roughness. Row 614 shows data for the EUV resist layer without a conformal thin film and before etching. Row 615 shows data for the target layer after etching using an EUV resist layer without a conformal thin film. Row 616 shows data for a conformal thin film deposited on the EUV resist at 75 W 50% DC, which had an internal stress of +25 MPa (Positive number correlate to tensile stress, while negative numbers denote compressive stress). Finally, row 617 shows data for a conformal thin film deposited on the EUV resist at 75 W 3% DC, which had an internal stress of −46 MPa.

Columns 618 and 619 demonstrate the improvement from using a conformal thin film as disclosed herein. The values in column 618 represent the improvement in the PSD value of an EUV resist having a conformal thin film compared to an EUV resist without a conformal thin film. These numbers are the same as those shown in FIG. 4 for the same process conditions. The values in column 619 represent the improvement in the PSD value after etching the target layer with and without a conformal thin film. A modest decrease of 10% in roughness can be achieved by the etch process. Adding in a conformal thin film, however, may dramatically decrease the roughness. Depositing a conformal thin film under 75 W and 50% DC will cause a 60% decrease in roughness before etching, and a 72% decrease in roughness after etching. Depositing a conformal thin film under 75 W and 3% DC will cause a comparatively lower 14% decrease in roughness before etching, but the etch process leads to a 37% decrease in roughness after etching.

As is clear from the graph and chart, EUV resists with conformal thin films having greater tensile stress had smaller PSD values, and therefore less LER, than EUV resists without a conformal thin film or conformal thin films with less tensile stress. The reduction in LER of the EUV resist can then be translated to the target layer during subsequent etch processes, reducing the LER and LWR of etched features.

Apparatus

Figure 7A:
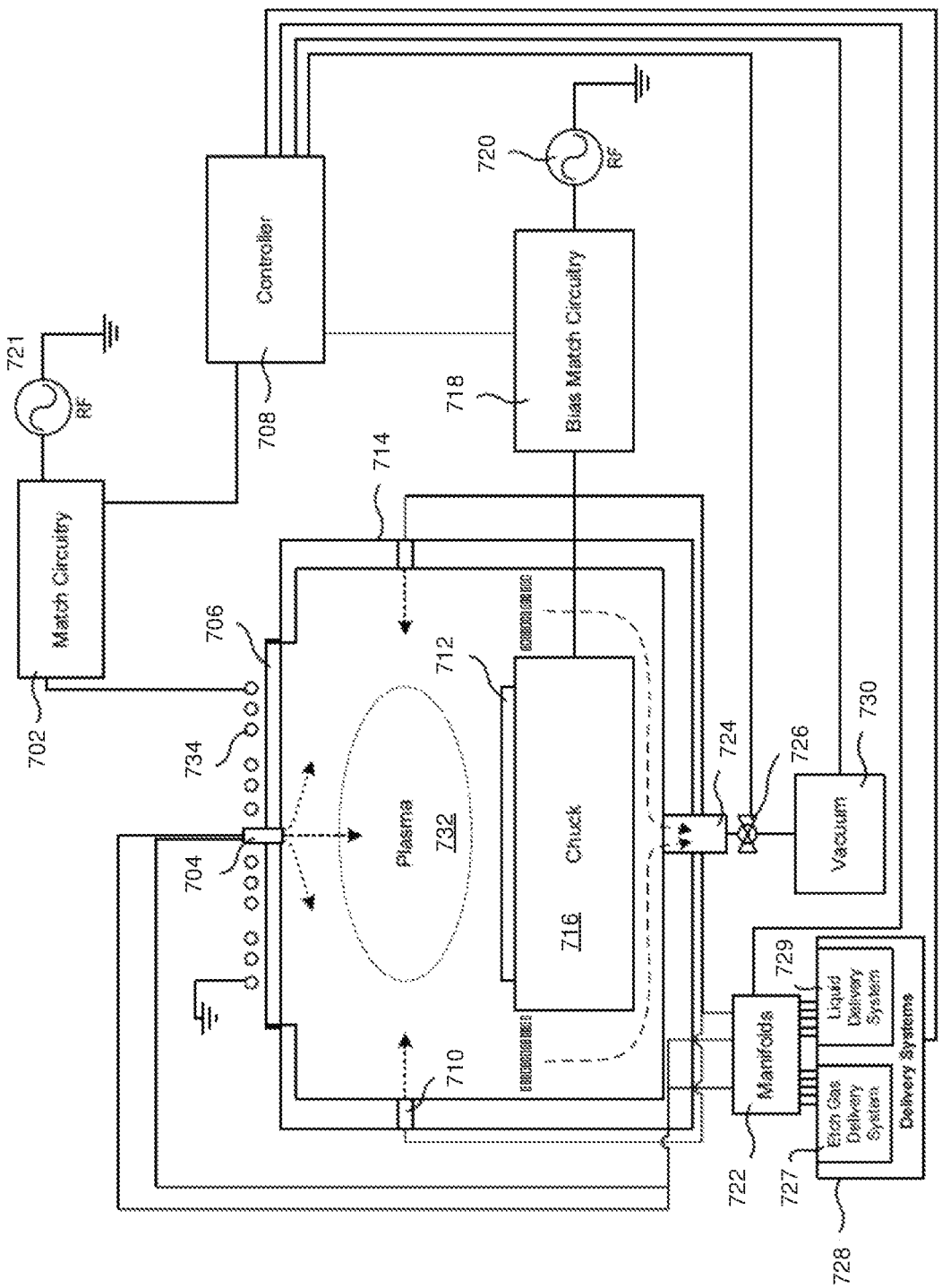
FIGS. 7A, 7B, and 7C are schematic diagrams of an example process chamber for performing disclosed embodiments.

FIG. 7A is a schematic cross-sectional diagram showing a plasma processing system that may be used for etching operations, in accordance with various embodiments. The system includes a chamber 732 that includes a chamber body 714, a chuck 716, and a dielectric window 706. The chamber 732 includes a processing region and the dielectric window 706 is disposed over the processing region. The chuck 716 can be an electrostatic chuck for supporting a substrate 712 and is disposed in the chamber below the processing region. In some embodiments, an internal Faraday shield (not shown) is disposed inside the chamber 700 beneath the dielectric window 706. A TCP coil 734 is disposed over the dielectric window 706 and is connected to match circuitry 702.

The system includes a bias RF generator 720, which can be defined from one or more generators. If multiple generators are provided, different frequencies can be used to achieve various tuning characteristics. A bias match 718 is coupled between the RF generators 720 and a conductive plate of the assembly that defines the chuck 716. The chuck 716 also includes electrostatic electrodes to enable the chucking and dechucking of the wafer. Broadly, a filter and a DC clamp power supply can be provided. Other control systems for lifting the wafer off of the chuck 716 can also be provided.

A first gas injector 704 provides two different channels to inject two separate streams of process gases or liquid precursor (in vapor form) to the chamber from the top of the chamber. It should be appreciated that multiple gas supplies may be provided for supplying different gases to the chamber for various types of operations, such as process operations on wafers, waterless auto-cleaning (WAC) operations, and other operations. A second gas injector 710 provides another gas stream that enters the chamber through the side instead of from the top.

In the embodiment of FIG. 7A, independent gas streams may be delivered into the chamber. One stream can be injected through a center of injector 704. A second stream can be injected also through injector 704, but via a different path that surrounds the center of injector 704. The third stream may be injected into the side of the chamber via side injector 710. In one embodiment, gas injector 704 also provides for optical access into the process chamber, for example, along an axial path from a diagnostic endpoint outside the process chamber through an optical access window. More details for optical access into the chamber may be found in U.S. Pat. No. 7,928,366, entitled "Methods of and Apparatus for Accessing a Process Chamber Using a Dual Zone Gas Injector with Improved Optical Access," and issued on Apr. 19, 2011, the disclosure of which is incorporated herein by reference.

The various ways of injecting gases into the chamber have been described to illustrate that the etch gases and/or the liquid precursor can be provided into the chamber from various locations. In some cases, only the injector 704 is used. In other cases, only the side injector 710 is used. In other cases, both the injector 704 and the side injector 710 may be used. In one configuration, manifolds 722 control which gases are supplied to each of the three different gas lines. Manifolds 722 allow for any type of gas (reactant, tuning, precursor, etc.) to be provided to any of the three different gas lines. In some embodiments tuning gases can include gases such as oxygen ($O_2$) or helium (He). The gases may be sent into the chamber without mixing, or be mixed with other gases before introduction into the chamber.

A vacuum pump 730 is connected to the chamber 732 to enable vacuum pressure control and removal of gaseous byproducts from the chamber during operational plasma processing. A valve 726 is disposed between exhaust 724 and the vacuum pump 730 to control the amount of vacuum suction being applied to the chamber.

The dielectric window 706 can be defined from a ceramic material or a ceramic-type material. Other dielectric materials are also possible, so long as they are capable of withstanding the conditions of a semiconductor etching chamber. Typically, chambers operate at elevated temperatures ranging between zero degrees Celsius and approximately 200 degrees Celsius. The temperature will depend on the etching process operation and specific recipe. The chamber 732 will also operate at vacuum conditions in the range of between about 1 mTorr (mT) and about 500 mTorr (mT). As used herein, the terms "about" and "approximately" mean that the specified parameter can be varied within a reasonable tolerance, e.g., ±20%.

Although not all specifically shown, chamber 732 is typically coupled to facilities when installed in either a clean room or a fabrication facility. Facilities include plumbing that provide, among other things, processing gases, vacuum, temperature control, and environmental particle control. These facilities are coupled to chamber 732, when installed in the target fabrication facility. Additionally, chamber 732 may be coupled to a transfer chamber that will enable robotics to transfer semiconductor wafers into and out of chamber 732 using automation.

A programmable controller 708 is provided for controlling the operation of the chamber 732 and its associated components. Broadly speaking, the controller 708 can be programmed to execute a chamber operation defined by a recipe. A given recipe may specify various parameters for the operation, such as the application of power to the TCP cads, the flow of gas into the chamber, and the application of vacuum. It should be appreciated that the timing, duration, magnitude, or any other adjustable parameter or controllable feature can be defined by a recipe and carried out by the controller to control the operation of the chamber 732 and its associated components. Additionally, a series of recipes may be programmed into the controller 708. In one embodiment, the recipe is configured to process etch operations and includes one or cycles of an atomic layer deposition (ALDr) process performed in between each of the etch operations.

Figure 7B:
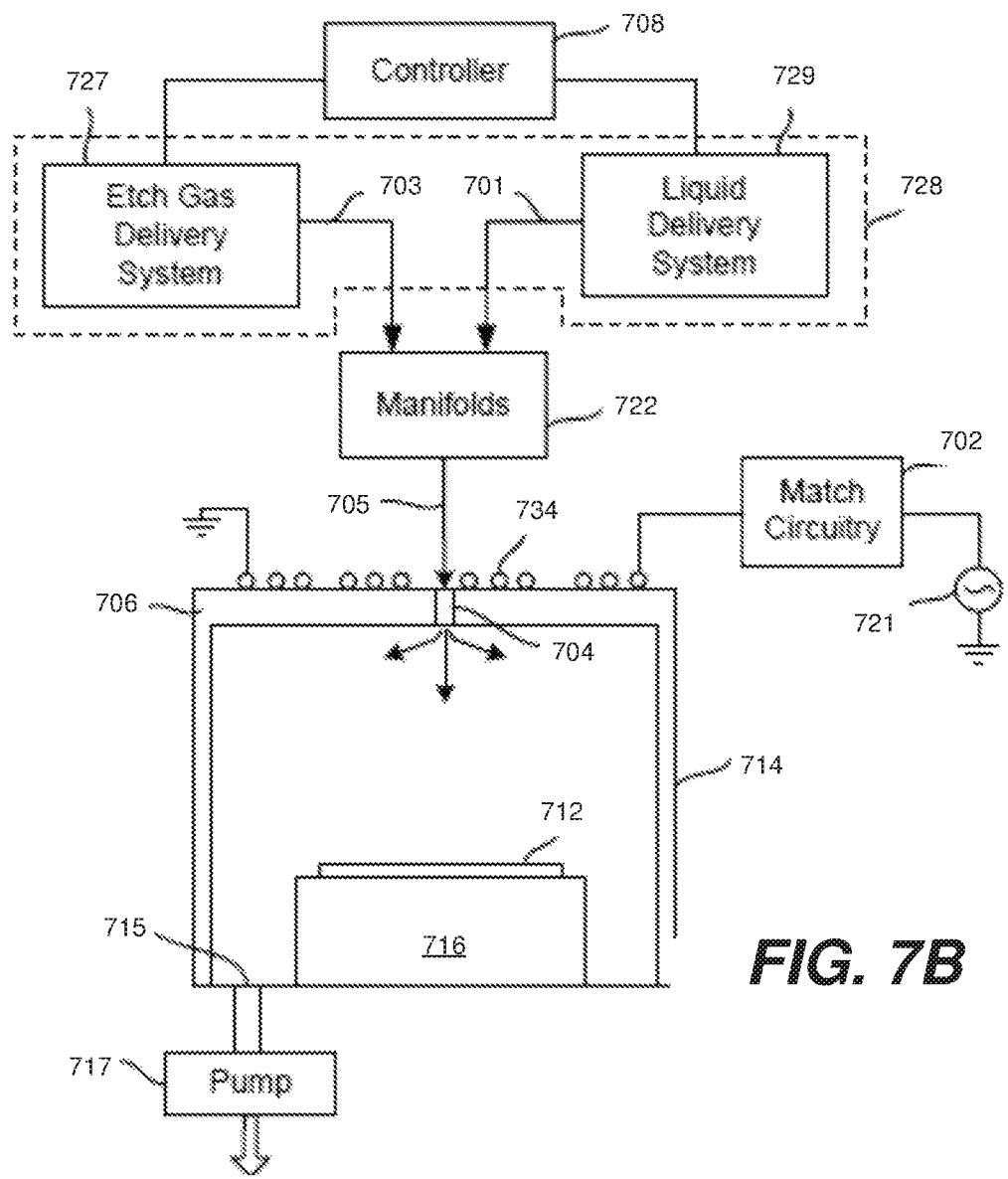

FIG. 7B is a schematic cross-sectional diagram of a plasma processing system that may be used for etching operations, in accordance with various embodiments. As shown in FIG. 7B, chuck 716 is disposed within chamber body 714, which is provided with dielectric window 706. In one embodiment, chuck 716 is an electrostatic chuck for supporting a substrate 712. A TCP coil 734 is disposed aver the dielectric window 706 and is connected to match circuitry 702, which is coupled to RF generator 721. In the embodiment of FIG. 7B, delivery systems 728 include etch gas delivery system 727 and liquid delivery system 729. Etch gas delivery system 727 delivers etchant gases to manifolds 722 via conduit 703. Liquid delivery system 729 delivers liquid precursor (in vapor form) to manifolds 722 via conduit 701, as will be explained in more detail below with reference to FIG. 7C. The manifolds 722, in response to control from controller 108, enable the outputs from the respective delivery systems to flow to the chamber body 714 via conduit 705 at the appropriate times by selecting, switching, and/or mixing the outputs using, for example, a plurality of valves for switching between gases and/or vapor. The outputs from the respective delivery systems flow from conduit 705 into the chamber body 714 via gas injector 704, which is located at the top of the chamber body. To facilitate purging of the chamber, the base of chamber body 714 is provided with an outlet 715, which is connected in flow communication with a pump 717. In one embodiment, the pump 717 is a turbopump. Those skilled in the art will appreciate that the base of chamber body 714 can be provided with multiple outlets each of which is connected to a suitable pump.

Figure 7C:
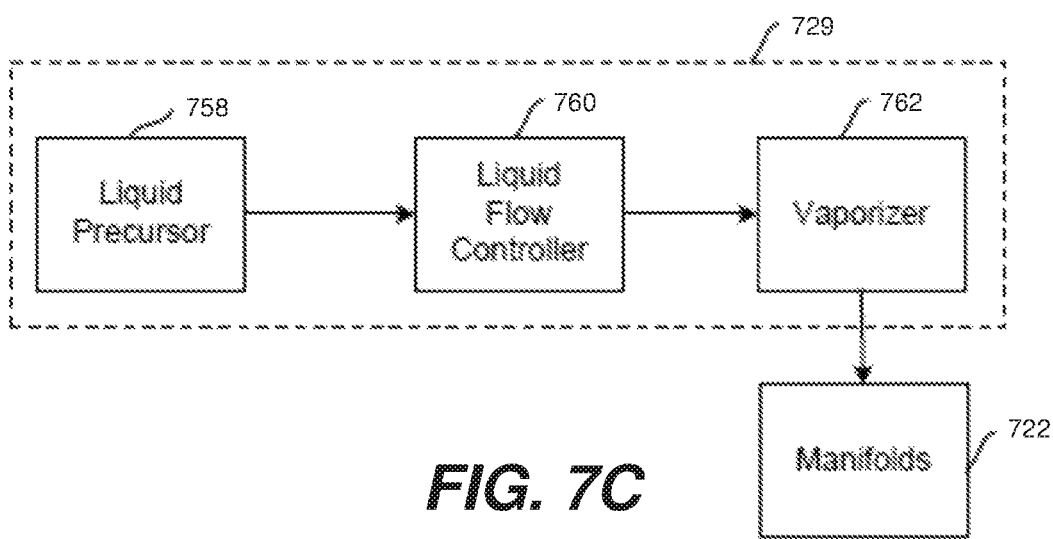

FIG. 7C is a schematic diagram that illustrates additional details of a liquid delivery system that may be used in accordance with various embodiments. As shown in in FIG. 7C, liquid delivery system 729 includes a source of liquid precursor 758, a liquid flow controller 760, and a vaporizer 762. The source of liquid precursor 758 can be coupled in flow communication to facilities that provide suitable liquid precursors. As stated above, any liquid precursor capable of forming a conformal atomic monolayer can be used. The liquid precursor flows from source 758 to liquid flow controller 760, which regulates the amount of flow based on instruction received from controller 708 (see, e.g., FIG. 7B). In one embodiment, the amount of the liquid precursor is in the range from about 50 microliters to about 1,000 microliters. The liquid precursor flows from the liquid flow controller 760 to vaporizer 762, which converts the liquid precursor from the liquid state to the vapor state. The vaporized precursor flows to manifolds 722, which, based on control received from the controller 708, supplies the vaporized precursor to gas injector 704 (see, e.g., FIG. 7A) at the appropriate time. The vaporized precursor flows through gas injector 704 into the chamber 732 defined by chamber body 714 (see, e.g., FIG. 7A).

Figure 8:
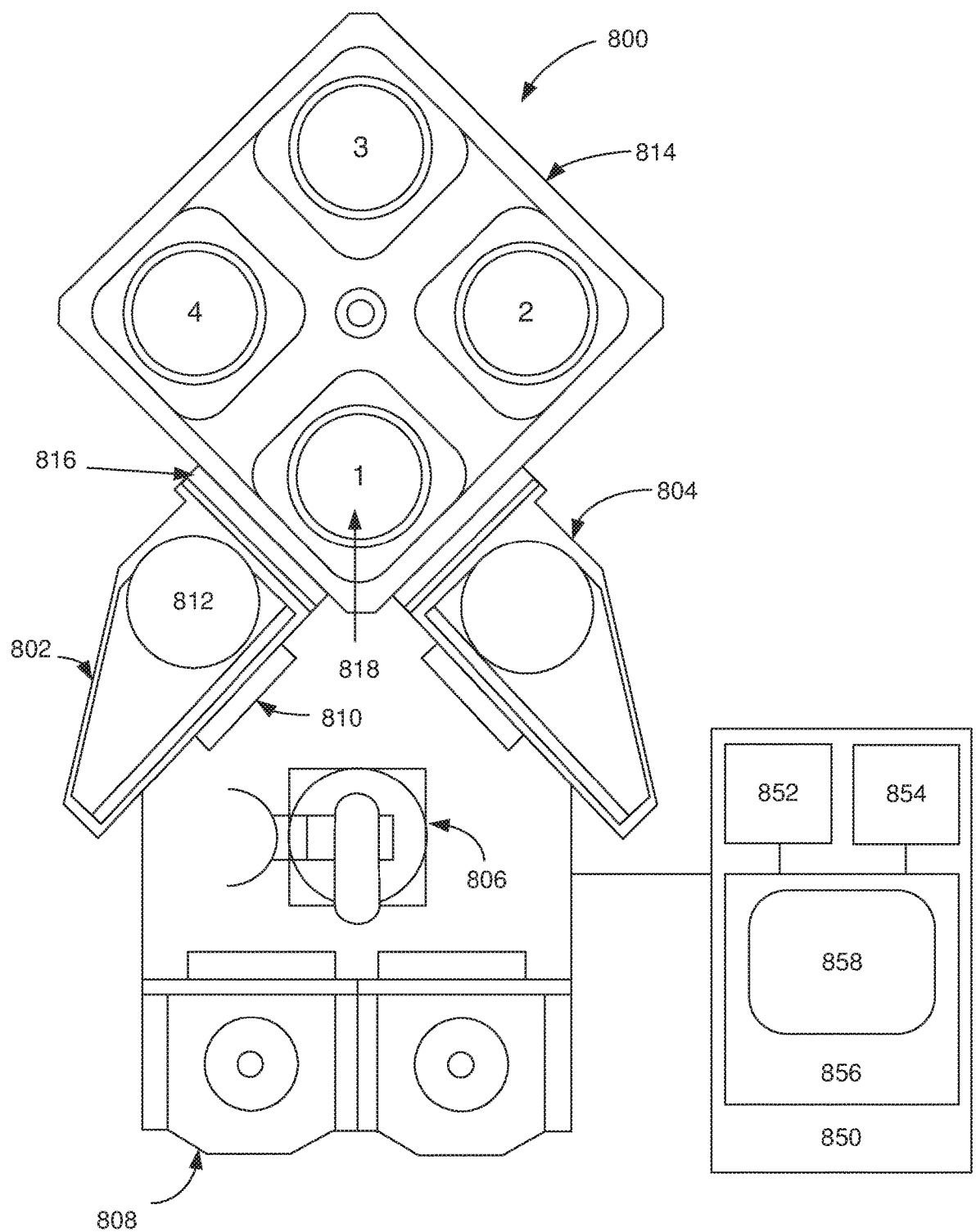
FIG. 8 is a schematic diagram of an example process apparatus for performing disclosed embodiments.

As described above, one or more process stations may be included in a multi-station processing tool. FIG. 8 shows a schematic view of an embodiment of a multi-station processing tool 800 with an inbound load lock 802 and an outbound load lock 804, either or both of which may include a remote plasma source (not shown in FIG. 8), A robot 806, at atmospheric pressure, is configured to move wafers from a cassette loaded through a pod 808 into inbound load lock 802 via an atmospheric port 810. A wafer (not shown in FIG. 8) is placed by the robot 806 on a pedestal 812 in the inbound load lock 802, the atmospheric port 810 is closed, and the inbound load lock 802 is pumped down. Where the inbound load lock 802 includes a remote plasma source, the wafer may be exposed to a remote plasma treatment in the inbound load lock 802 prior to being introduced into a processing chamber 814. Further, the wafer also may be heated in the inbound load lock 802 as well, for example, to remove moisture and adsorbed gases. Next, a chamber transport port 816 to processing chamber 814 is opened, and another robot (not shown) places the wafer into the reactor on a pedestal of a first station shown in the reactor for processing. While the embodiment depicted in FIG. 8 includes load locks, it will be appreciated that, in some embodiments, direct entry of a wafer into a process station may be provided.

The depicted processing chamber 814 includes four process stations, numbered from 1 to 4 in the embodiment shown in FIG. 8. Each station has a heated pedestal (shown at 818 for station 1), and gas line inlets. It will be appreciated that in some embodiments, each process station may have different or multiple purposes. For example, in some embodiments, a process station may be switchable between an ALC, an ALD and plasma-enhanced ALD process mode. In some embodiments, exposure to a deposition precursor and exposure to a second reactant and plasma are performed in the same station. Additionally or alternatively, in some embodiments, processing chamber 814 may include one or more matched pairs of ALD and plasma-enhanced ALD process stations. While the depicted processing chamber 814 includes four stations, it will be understood that a processing chamber according to the present disclosure may have any suitable number of stations. For example, in some embodiments, a processing chamber may have five or more stations, while in other embodiments a processing chamber may have three or fewer stations.

FIG. 8 depicts an embodiment of a wafer handling system 890 for transferring wafers within processing chamber 814. In some embodiments, wafer handling system 890 may transfer wafers between various process stations and/or between a process station and a load lock. It will be appreciated that any suitable wafer handling system may be employed. Non-limiting examples include wafer carousels and wafer handling robots. FIG. 8 also depicts an embodiment of a system controller 850 employed to control process conditions and hardware states of process tool 800. System controller 850 may be the same as, or different than, controller 708. System controller 850 may include one or more memory devices 856, one or more mass storage devices 854, and one or more processors 852. Processor 852 may include a CPU or computer, analog, and/or digital input/output connections, stepper motor controller boards, etc.

In some embodiments, system controller 850 controls all of the activities of process tool 800. System controller 850 executes system control software 858 stored in mass storage device 854, loaded into memory device 856, and executed on processor 852. Alternatively, the control logic may be hard coded in the controller 850. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 858 may include instructions for controlling the timing, mixture of gases, gas flow rates, chamber and/or station pressure, chamber and/or station temperature, wafer temperature, target power levels, RF power levels, substrate pedestal, chuck and/or susceptor position, and other parameters of a particular process performed by process tool 800. System control software 858 may be configured in any suitable way. For example, various process tool component subroutines or control objects may be written to control operation of the process tool components used to carry out various process tool processes. System control software 858 may be coded in any suitable computer readable programming language.

In some embodiments, system control software 858 may include input/output control (IOC) sequencing instructions for controlling the various parameters described above. Other computer software and/or programs stored on mass storage device 854 and/or memory device 856 associated with system controller 850 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 818 and to control the spacing between the substrate and other parts of process tool 800.

A process gas control program may include code for controlling gas composition (e.g., silicon-containing gases, oxygen-containing gases, and purge gases as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations in accordance with the embodiments herein.

A pressure control program may include code for maintaining the pressure in the reaction chamber in accordance with the embodiments herein.

In some embodiments, there may be a user interface associated with system controller 850. The user interface may include a display screen, graphical software displays of the apparatus and/or process conditions, and user input devices such as pointing devices, keyboards, touch screens, microphones, etc.

In some embodiments, parameters adjusted by system controller 850 may relate to process conditions. Non-limiting examples include process gas composition and flow rates, temperature, pressure, plasma conditions (such as RF bias power levels), etc. These parameters may be provided to the user in the form of a recipe, which may be entered utilizing the user interface.

Signals for monitoring the process may be provided by analog and/or digital input connections of system controller 850 from various process tool sensors. The signals for controlling the process may be output on the analog and digital output connections of process tool 800. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 850 may provide program instructions for implementing the above-described deposition processes. The program instructions may control a variety of process parameters, such as DC power level, RF bias power level, pressure, temperature, etc. The instructions may control the parameters to operate in-situ deposition of film stacks according to various embodiments described herein.

The system controller 850 will typically include one or more memory devices and one or more processors configured to execute the instructions so that the apparatus will perform a method in accordance with disclosed embodiments. Machine-readable media containing instructions for controlling process operations in accordance with disclosed, embodiments may be coupled to the system controller 850.

In some implementations, the system controller 850 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller 850, depending on the processing conditions and/or the type of system, may be programmed to control any of the processes disclosed herein, including the delivery of processing gases, temperature settings (e.g., heating and/or cooling), pressure settings, vacuum settings, power settings, radio frequency (RE) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 850 refers to electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller 850 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The system controller 850, in some implementations, may be a part of or coupled to a computer that is integrated with, coupled to the system, otherwise networked to the system, or a combination thereof. For example, the system controller 850 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 850 receives instructions in the form of data, which specify parameters for each of the processing steps to be performed during one or more operations. It should be understood that the parameters may be specific to the type of process to be performed and the type of tool that the system controller 850 is configured to interface with or control. Thus as described above, the system controller 850 may be distributed, such as by including one or more discrete controllers that are networked together and working towards a common purpose, such as the processes and controls described herein. An example of a distributed, controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an atomic layer clean (ALC) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the system controller 850 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

An appropriate apparatus for performing the methods disclosed herein is further discussed and described in U.S. patent application Ser. No. 13/084,399 (now U.S. Pat. No. 8,728,956), filed Apr. 11, 2011, and titled "PLASMA ACTIVATED CONFORMAL FILM DEPOSITION"; and Ser. No. 13/084,305, filed Apr. 11, 2011, and titled "SILICON NITRIDE FILMS AND METHODS," each of which is incorporated herein in its entireties.

The apparatus/process described herein may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of processing a substrate, the method comprising:
   providing to a process chamber a substrate comprising a patterned EUV resist disposed on a substrate layer to be etched, the patterned EUV resist having a first stress level; and
   depositing on the patterned EUV resist a conformal thin film having a second stress level that is less compressive than the first stress level, such that a third stress level of the patterned EUV resist resulting from the depositing of the conformal thin film is less compressive than the first stress level.

2. The method of claim 1, wherein the substrate is a semiconductor wafer comprising a partially fabricated semiconductor device.

3. The method of claim 1, wherein the conformal thin film has a thickness of no more than 2 nm.

4. The method of claim 1, wherein the conformal thin film has a thickness of about 1 nm.

5. The method of claim 1, wherein the conformal thin film second stress level is tensile.

6. The method of claim 1, wherein the conformal thin film second stress level is compressive.

7. The method of claim 1, wherein the patterned EUV resist is characterized by a line roughness that is decreased after the depositing.

8. The method of claim 1, wherein the line roughness comprises one or more of line edge roughness (LER) and line width roughness (LWR).

9. The method of claim 8, wherein the line roughness is a low frequency line roughness.

10. The method of claim 9, wherein the low frequency line roughness has a spatial frequency of less than 0.05 $nm^{-1}$.

11. The method of claim 8, wherein the line roughness is a high frequency line roughness.

12. The method of claim 11, wherein the high frequency line roughness has a spatial frequency of greater than 0.05 $nm^{-1}$.

13. The method of claim 8, wherein the line edge roughness decreases by an amplitude of from about 0.1 to 1 $nm^4$ (PSD).

14. The method of claim 1, wherein the conformal thin film comprises a Si-based dielectric.

15. The method of claim 14, wherein the dielectric is $SiO_2$.

16. The method of claim 1, wherein the conformal thin film is deposited by ALD.

17. The method of claim 16, wherein the ALD comprises plasma enhanced ALD wherein a cycle comprises flowing an oxygen plasma with a power between 10 W and 2500 W and a duty cycle between 25% and 50%.

18. The method of claim 17, wherein the EUV resist comprises a chemically amplified resist (CAR), an organo-metal, or an organometal oxide.

19. The method of claim 18, wherein the organo-metal oxide is an organo-tin oxide.

20. The method of claim 1, further comprising, etching the substrate layer in the process chamber after the depositing of the conformal thin film.

* * * * *